(12) United States Patent
Koriyama et al.

(10) Patent No.: US 6,239,669 B1
(45) Date of Patent: May 29, 2001

(54) HIGH FREQUENCY PACKAGE

(75) Inventors: Shinichi Koriyama; Mikio Fujii; Kenji Kitazawa, all of Kokubu (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 09/067,251

(22) Filed: Apr. 27, 1998

(30) Foreign Application Priority Data

| Apr. 25, 1997 | (JP) | 9-108726 |
| Apr. 25, 1997 | (JP) | 9-108727 |
| Apr. 25, 1997 | (JP) | 9-108728 |
| Apr. 25, 1997 | (JP) | 9-108729 |
| Sep. 30, 1997 | (JP) | 9-266312 |
| Oct. 31, 1997 | (JP) | 9-300926 |

(51) Int. Cl.⁷ .................................................. H01P 5/107
(52) U.S. Cl. .................................... 333/26; 333/247
(58) Field of Search .............................. 333/26, 247

(56) References Cited

U.S. PATENT DOCUMENTS

| 3,683,241 | 8/1972 | Duncan | 333/247 X |
| 3,924,204 | 12/1975 | Fache et al. | 333/21 R |
| 4,453,142 | 6/1984 | Murphy | 333/26 |
| 5,028,891 | * | 7/1991 | Lagerlof | 333/26 |
| 5,235,300 | * | 8/1993 | Chan et al. | 333/26 |
| 5,396,202 | 3/1995 | Scheck | 333/230 |
| 5,414,394 | 5/1995 | Gamand et al. | 333/26 |
| 5,770,981 | * | 6/1998 | Koizumi et al. | 333/26 |
| 5,793,263 | * | 8/1998 | Pozar | 333/26 |
| 5,808,519 | * | 9/1998 | Gotoh et al. | 333/26 |
| 5,982,250 | * | 11/1999 | Hung et al. | 333/26 |

FOREIGN PATENT DOCUMENTS

| 0599316 | 6/1994 | (EP) . |
| 59-049003 | 3/1984 | (JP) . |
| 9627913 | 9/1996 | (WO) . |
| 9744851 | 11/1997 | (WO) . |

* cited by examiner

Primary Examiner—Benny Lee
(74) Attorney, Agent, or Firm—Hogan & Hartson, LLP.

(57) ABSTRACT

A high-frequency package comprising a dielectric substrate, a high-frequency element that operates in a high-frequency region and is mounted in a cavity formed on said dielectric substrate, and a microstrip line formed on the surface or in an inner portion of said dielectric substrate and electrically connected to said high-frequency element, wherein a signal transmission passage of a waveguide is connected to a linear conducting passage or to a ground layer constituting the microstrip line. In the junction portion of the waveguide, for example, an end of the linear conducting passage is electromagnetically opened, so that the end portion works as a monopole antenna inside the waveguide that is connected. The high-frequency package makes it possible to connect the waveguide without adversely affecting the sealing of the high-frequency element and to transmit high-frequency signals with a low loss.

8 Claims, 21 Drawing Sheets

HIGH FREQUENCY PACKAGE

BACKGROUND OF THE INVENTION

1. Field of the Invention

The present invention relates to a high-frequency package sealing a high-frequency element (e.g., semiconductor element) that operates in a high-frequency region and, particularly, in a millimeter wave region. More specifically, the invention relates to a high-frequency package that can be directly connected to a waveguide that is connected to an external electric circuit board (mother board) and that is capable of transmitting high-frequency signals with a low loss.

2. Description of the Prior Art

In an information-oriented society in recent years, information is transmitted in a wireless manner and on a personal basis as represented by a portable telephone. Under such circumstances, semiconductor elements that operate in a millimeter wave region (30 to 300 GHz) have been developed in order to transmit information at high speeds and in large quantities. Accompanying the progress in the high-frequency semiconductor element technology in recent years, a variety of applied systems have been proposed using electromagnetic waves in a millimeter wave region, such as a distance-between-the-cars radar and a wireless LAN. For example, there have been proposed a distance-between-the-cars radar using millimeter waves (see SC-7-6, Convention of Electronics Society, Japanese Academy of Electronic Information Communications, 1995), a cordless camera system (see C-137, Convention of Electronics Society, Japanese Academy of Electronic Information Communications, 1995), a high-speed wireless LAN (see C-139, Convention of Electronics Society, Japanese Academy of Electronic Information Communications, 1995).

Accompanying the application of millimeter waves, fabrication technology has also been improved to apply such waves. In dealing with a variety of electronic parts, in particular, a problem is how to decrease the size and cost while maintaining the required transmission characteristics.

Among the fabrication technologies, a serious problem remains in regard to a package containing a high-frequency element and a waveguide so that it is connected to an external electric circuit simply and with a small size. In particular, a problem is how to connect a package mounting a high-frequency element to an external electric circuit having a waveguide with the smallest transmission loss.

A conventional high-frequency package can be connected to a waveguide connected to an external electric circuit by a method in which a transmission passage formed in a high-frequency package is converted into a coaxial line by a connector, or a method in which the waveguide is connected to a microstrip line which is then connected to a transmission passage in the high-frequency package.

In recent years, there has been proposed a method in which a package containing a high-frequency element is directly connected to a waveguide in the external electric circuit (see SC-7-5, Convention of Electronics Society, Japanese Academy of Electronic Information Communications, 1995). According to this proposal, quartz is deposited to hermetically seal the element in a cavity, and the electromagnetic waves are introduced into the cavity through an area where quartz is deposited, to accomplish the connection to a waveguide-microstrip line converter board installed in the cavity.

According to the method of connecting the waveguide to the package through another transmission line such as a microstrip line or a connector, however, the structure of the connection becomes complex and, besides, a region must be maintained for forming a connector or other transmission line, causing the structure of the connection to become bulky. Moreover, the transmission loss may increase through the other line or connector.

On the other hand, the method of directly introducing the electromagnetic waves from the waveguide into the cavity in the package is effective in decreasing the size of the structure for connection. In order to decrease the loss of electromagnetic waves that pass through the member for forming a cavity (such as a closure), however, the portion for passage must be formed of a material having a small dielectric constant and a small loss tangent. For this purpose, a material having a low dielectric constant and a small loss, such as quartz, must be enclosed. However, the enclosing treatment not only loses reliability in the hermetic sealing but also is not quite suited for mass-production.

All of the cavity-forming member can be formed of a material having a low dielectric constant and a small loss. In fact, however, the material for constituting the package requires a variety of properties such as mechanical strength, air-tightness and metallizing property in addition to electric properties. There is available no suitable material that satisfies all of these properties and that can be cheaply obtained.

That is, the above-mentioned difficulty stems from the introduction of the high-frequency signals in the form of electromagnetic waves into the cavity of the package through the waveguide. That is, the signals are in the form of electromagnetic waves at a portion where they are introduced into the cavity, and it becomes necessary to accomplish both air-tight sealing and low loss in this portion.

SUMMARY OF THE INVENTION

It is therefore an object of the present invention to provide a high-frequency package which is simple in construction without adversely affecting the air-tightness of the high-frequency elements, which can be directly connected to the waveguide provided in an external electric circuit board or the like, and which is capable of transmitting high frequency signals with a small loss.

The present inventors have succeeded in accomplishing the above-mentioned object by using means, such as electromagnetic coupling. The high-frequency packages of the present invention can be roughly divided into the type in which a waveguide is coupled to a linear conducting passage that constitutes a microstrip line in the package (hereinafter referred to as a package of the linear conductor connection type) and the type in which a waveguide is coupled to a microstrip line via a ground layer that constitutes the microstrip line (hereinafter referred to as package of the ground layer connection type).

According to the present invention, there is provided a high-frequency package (linear conductor connection-type package) comprising a dielectric substrate, a high-frequency element that operates in a high-frequency region and is mounted in a cavity formed on the dielectric substrate, and a high-frequency signal transmission passage formed on the surface or in an inner portion of the dielectric substrate and electrically connected to the high-frequency element, wherein:

a flange portion for connection to a waveguide is formed at the peripheral edge on the outside of cavity in the dielectric substrate; and the high-frequency signal transmission passage is formed by a ground layer and a linear conducting passage, the linear conducting passage has a signal conductor that is electromagnetically opened at the flange portion, and the signal conductor infiltrates into the waveguide connected to the flange portion and works as a monopole antenna.

According to the present invention, there is provided a high-frequency package (ground layer connection-type package) comprising a dielectric substrate, a high-frequency element that operates in a high-frequency region and is mounted in a cavity formed on the dielectric substrate, and a high-frequency signal transmission passage formed on the surface or in an inner portion of the dielectric substrate and electrically connected to the high-frequency element, wherein:

the high-frequency signal transmission passage has a microstrip line constituted by a linear conducting passage connected to the high-frequency element and a ground layer opposed to the linear conducting passage with a dielectric layer sandwiched therebetween; and the ground layer has a slot formed therein at a position opposed to an end of the linear conducting passage, and a waveguide is so connected that a portion of the ground layer including the slot constitutes a conductor wall that forms a signal transmission space in the waveguide.

BRIEF DESCRIPTION OF THE DRAWINGS

FIGS. 1A and 1B top sectional view and side sectional view, respectively, are diagrams illustrating a package of the linear conductor connection type of the present invention;

FIGS. 4A and 4B top sectional view and side sectional view, respectively, illustrate another package of the linear conductor connection type;

FIGS. 7A and 7B top sectional view and side sectional view, respectively, are diagrams illustrating the package of the linear conductor connection type equipped with a waveguide terminating member;

FIGS. 12A and 12B top sectional view and side sectional view, respectively, are diagrams illustrating a package of the ground layer connection type of the present invention;

DETAILED DESCRIPTION OF THE INVENTION

The invention will now be described in detail by way of examples shown in the accompanying drawings.

Figure 1A:
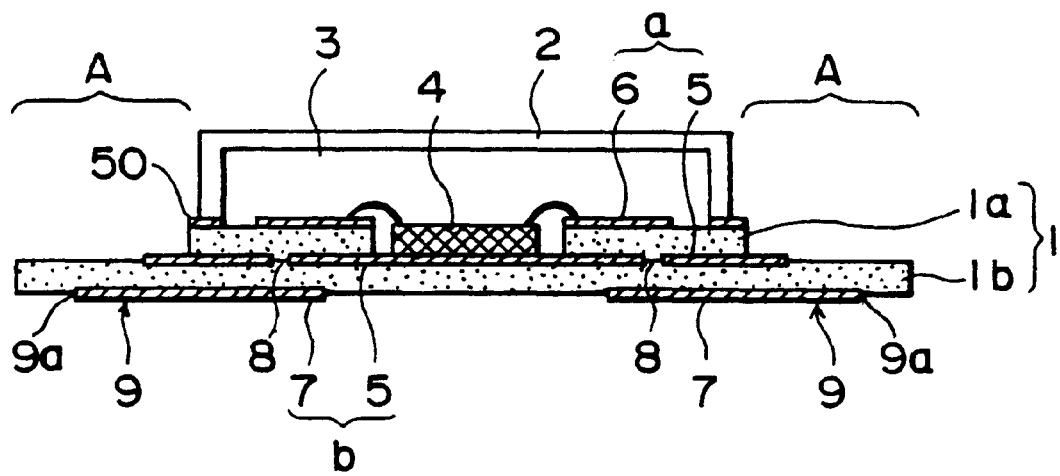
Figure 1B:
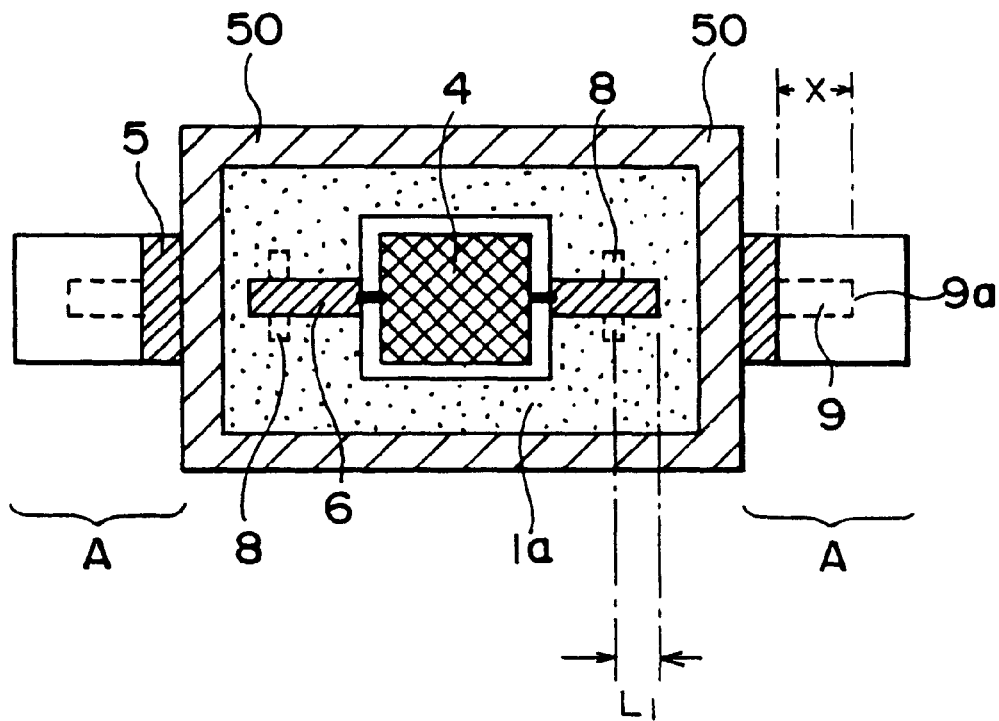

Referring to FIGS. 1A and 1B (FIG. 1A is a side sectional view, and FIG. 1B is a plan view illustrating a state where the closure is removed) illustrating a high-frequency package of the linear conductor connection type of the present invention, the high-frequency package is equipped with a dielectric substrate 1 and a closure 2, and the dielectric substrate 1 is constituted by two dielectric layers 1a and 1b. The closure 2 is brazed onto the dielectric layer 1a of the upper side, and a cavity 3 is formed by the closure 2 and the dielectric substrate 1. In FIGS. 1A and 1B, the blazed conducting layer is denoted by 50. However, the closure 2 needs not be necessarily secured by brazing but may be secured to the dielectric substrate 1 using, for example, an adhesive resin or the like. As shown in FIG. 1B, furthermore, a recessed portion is formed in the upper dielectric layer 1a, and a high-frequency element 4 is mounted in the recessed portion and is sealed in the cavity 3.

In this package, a ground layer 5 is provided between the dielectric layers 1a and 1b, and a first linear conducting passage 6 is provided on the surface of the upper dielectric layer 1a, the first linear conducting passage 6 being connected to the high-frequency element 4 by bonding a wire. A second linear conducting passage 7 is provided on the lower surface of the dielectric layer 1b that serves as a bottom surface of the dielectric substrate 1. That is, the high-frequency signal transmission passage formed in the package comprises a first microstrip line (a) constituted by the first linear conducting passage 6 and the ground layer 5, and a second microstrip line (b) constituted by the second linear conducting passage 7 and the ground layer 5. The ground layer 5 has a slot 8 formed therein, and an end of the first linear conducting passage 6 and an end of the second linear conducting passage 7 are opposed to each other with the slot 8 sandwiched therebetween. Here, a distance $L_1$ from the center of the slot 8 to the ends of the linear conducting passages 6, 7 is so selected as to correspond to one-fourth the wavelength of the transmission signals. Thus, the first microstrip line (a) and the second microstrip line (b) are electromagnetically coupled together through the slot 8. Therefore, a signal transmitted, for example, from an external unit to the second microstrip line (b) is transmitted to the first microstrip line (a) through the slot 8, and is further transmitted to the high-frequency element 4.

It is also possible to couple the first microstrip line (a) and the second microstrip line (b) together without relying upon the electromagnetic coupling. For example, a via-hole conductor is provided penetrating through the slot 8, and the first linear conducting passage 6 and the second linear conducting passage 7 are directly connected together through the via-hole conductor. In order to favorably and electromagnetically couple the microstrip lines (a) and (b) together, furthermore, the width of the linear conducting passages 6 and 7 may be broadened, the slot 8 may be formed in the shape of a dogbone, or a plurality of via-hole conductors may be connected to the ground layer so as to surround the slot 8.

In the above-mentioned high-frequency package as clearly shown in FIG. 1A, the lower dielectric layer 1b has a flange portion A that is formed to outwardly protrude beyond the upper dielectric layer 1a in which the cavity 3 is formed, and a waveguide is connected to the flange portion A.

On the upper surface of the flange portion A for connection to the waveguide, the ground layer 5 protrudes beyond the dielectric layer 1a, and the upper surface of the ground layer 5a is exposed. On the back surface of the flange portion A, on the other hand, the second linear conducting passage 7 outwardly extends beyond the ground layer 5a thereby to form an electromagnetically opened portion 9. A distance X (see FIG. 1B) from an end 9a of the portion 9 to an end of the ground layer 5 is selected to be equivalent to one-fourth the wavelength of the transmission signals. That is, the electromagnetically opened portion 9 serves as a signal conductor and works as a monopole antenna of ¼ wavelength in the structure for connection to the waveguide that will be described below.

Figure 2:
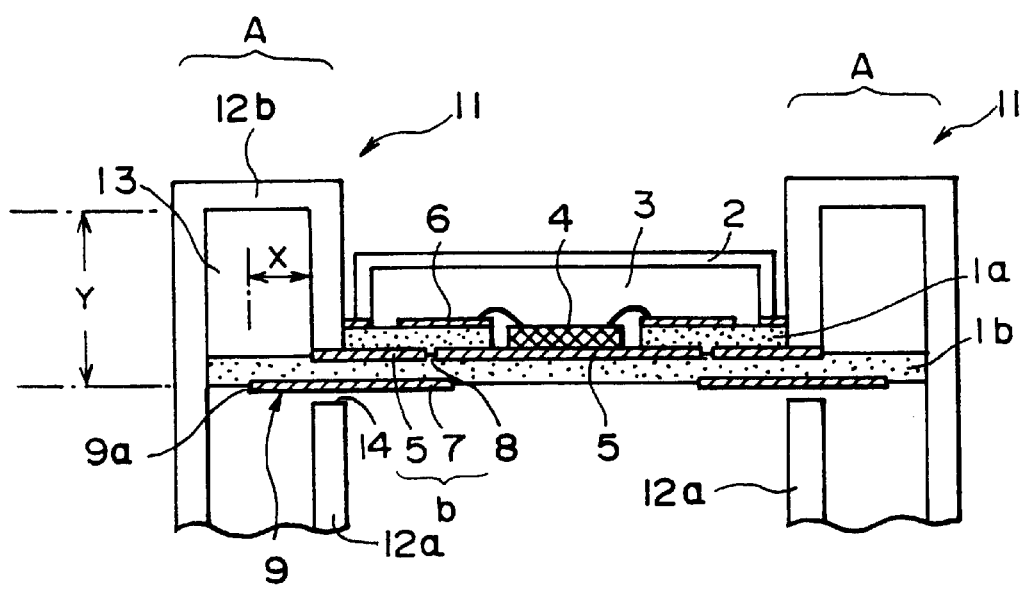
FIG. 2 is a diagram illustrating a structure for connecting the package of FIGS. 1A and 1B to a waveguide.

FIG. 2 is a diagram illustrating a structure for connecting the package of FIG. 1 to the waveguide, and wherein the waveguide 11 connected to the flange portion A has a signal transmission space 13 partitioned by a conductor wall 12a, 12b. In the present invention, an opening 14 is formed in a conductor wall 12a on the side surface of the waveguide 11, i.e., formed in a conductor wall 12a that serves as an H-plane for the high-frequency signals transmitted through the transmission space 13. The signal conductor 9 having an open end 9a is inserted in the signal transmission space 13 through the opening 14, and a distance X between the open end 9a of the signal conductor 9 and the conductor wall 12a is selected to be equivalent to one-fourth the wavelength of the transmission signals. Due to the above-mentioned structure for connection, the signal conductor 9 having the open end 9a works as a monopole antenna of a ¼ wavelength of transmission signals, and the high-frequency signals that have transmitted through the signal transmission space 13 in the waveguide 11 are transmitted to the second microstrip line (b) in the package through the signal conductor 9 and are transmitted to the high-frequency element 4 through the first microstrip line (a) as described earlier. In this case as a matter of course, the signal conductor 9 (or the second linear conducting passage 7 in the package) is set to be not in contact with the conductor wall 12 of the waveguide 11, and the conductor wall 12 of the waveguide 11 is set to assume the same potential as the ground layer 5. It is therefore desired that the waveguide 11 is adhered and secured to the dielectric layer 1b and is, further, brazed onto a protruded portion of the flange portion A of the ground layer 5. It is further desired that the brazed conductor layer 50 to which the closure 2 is adhered and secured, is brought into contact with the conductor wall 12 of the waveguide 11, so that static electricity will not be accumulated in the waveguide 11 and in the closure 2. It is desired that the end of the dielectric layer 1b infiltrating into the waveguide 11 together with the signal conductor 9 is intimately adhered onto the inner surface of the conductor wall 12 to stably hold the waveguide 11 in the package. Depending upon the cases, however, the end may be separated from the inner surface of the conductor wall 12. It is further desired that the opening 14 formed in the conductor wall 12a of the side surface is as small as possible. In the above-mentioned embodiment, furthermore, the waveguide 11 is so connected that the inner surface of the conductor wall 12a is brought into perfect agreement with the end of the ground layer 5. Here, the conductor wall 12 may be maintained contacted to the ground layer 5 so as to assume the same potential as the ground layer 5. Therefore, the distance X between the open end 9a of the signal conductor 9 and the ground layer 5 may often be longer than one-fourth the wavelength of the transmission signals by about the thickness of the conductor wall 12a.

The above-mentioned waveguide 11 can be connected to the package at any position. When the waveguide 11 is connected to the package near the end of the waveguide 11, however, it is desired that a distance Y between the signal conductor 9 and the conductor wall 12b that becomes an end surface of the signal transmission space 13 is set to a length that corresponds to one-fourth the wavelength of the transmission signals. This helps enhance the transmission efficiency owing to the interference of signals reflected by the end surface.

Figure 3:
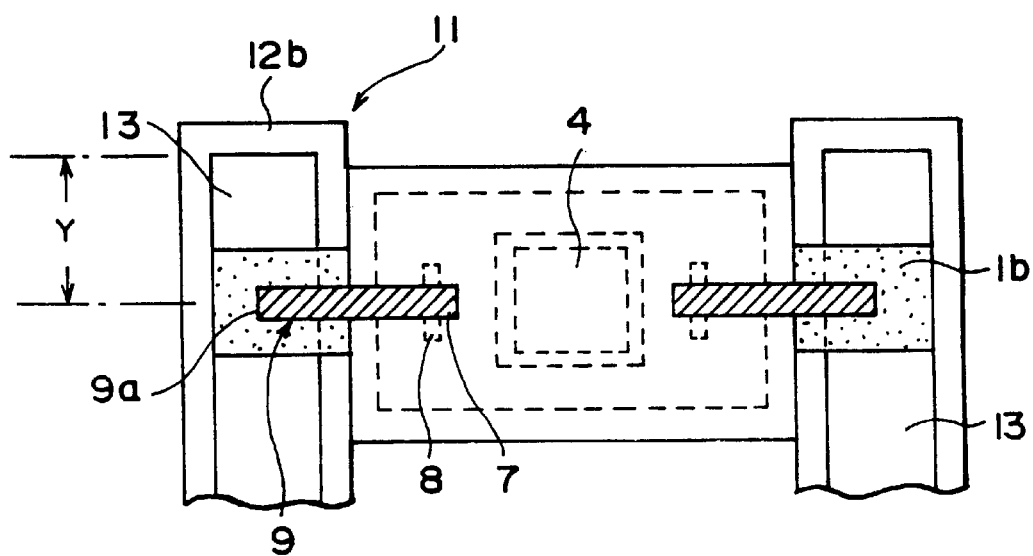
FIG. 3 is a diagram illustrating another structure for connecting the package of FIGS. 1A and 1B to the waveguide.

According to the connection structure of FIG. 2, the signal transmitted through the waveguide 11 is converted through the signal conductor 9 into a signal of a planar circuit formed on the dielectric substrate 1 of the package, and the thus converted signal is transmitted to the high-frequency element 4 via the electromagnetic coupling owing to the slot 8. Accordingly, the high-frequency package and the waveguide 11 can be connected together without deteriorating the sealing of the high-frequency element 4 (sealing of the cavity 3). In the embodiment of FIG. 2, furthermore, the waveguide is so connected that the plane of the dielectric layer 1b on which the signal conductor 9 is formed becomes in parallel with the end surface 12b of the waveguide 11. It is, however, also allowable to so connect the waveguide 11 that these surfaces become perpendicular relative to each other. FIG. 3 schematically illustrates a structure for connection. The structure for connection of FIG. 3 is quite the same as the structure for connection of FIG. 2 except that the direction of the waveguide 11 is different. Therefore, its description is omitted here.

Figure 4A:
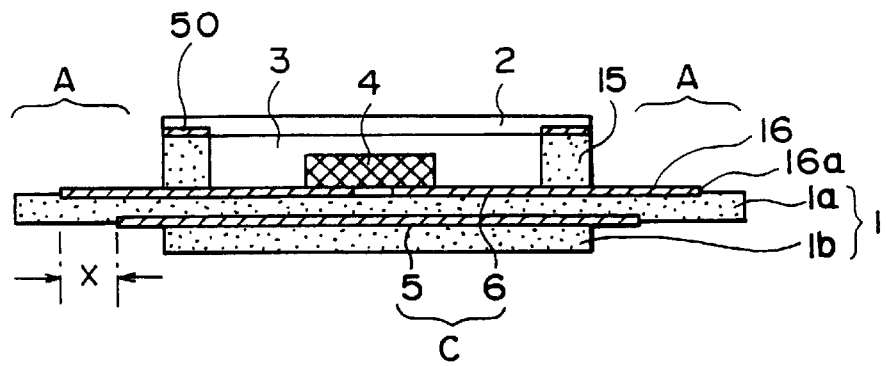
Figure 4B:
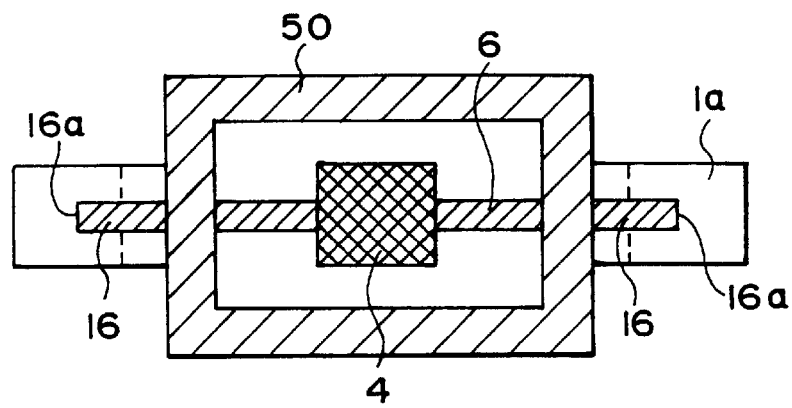

In the above-mentioned package of FIG. 1, the linear conducting passage that is not directly connected to the high-frequency element 4 is utilized for connection to the waveguide. It is, however, also allowable to utilize the linear conducting passage directly connected to the high-frequency element 4 for connection to the waveguide. FIGS. 4A and 4B are a side sectional view and a plan view of such a package.

In the package of FIGS. 4A and 4B, the dielectric substrate 1 is constituted by two dielectric layers 1a and 1b, a linear conducting passage 6 is formed on the surface of the upper dielectric layer 1a, and a ground layer 5 is formed between the dielectric layers 1a and 1b. Accordingly, a microstrip line (c) is constituted by the linear conducting passage 6 and the ground layer 5. On the other hand, the high-frequency element 4 is secured onto the surface of the dielectric layer 1a and is connected to the linear conducting passage 6. That is, the signals transmitted to the linear conducting passage 6 are directly transmitted to the high-frequency element 4. Moreover, a dielectric frame 15 is formed in the dielectric layer 1a so as to surround the high-frequency element 4, and a closure 2 is brazed to the upper end of the dielectric frame 15. Thus, the high-frequency element 4 is sealed in the cavity 3 formed by the closure 2.

In this package, the dielectric layer 1a (FIG. 1A) is outwardly protruding to form a flange portion A for connection to the waveguide. The ground layer 5 is slightly protruding into the flange portion A. Besides, the linear conducting passage 6 penetrates through the dielectric frame 15 to protrude onto the flange portion A and further protrudes beyond the end of the ground layer 5. In the flange portion A, an electromagnetically opened portion 16 (correspond to the signal conductor) is formed in the linear conducting passage 6 quite in the same manner as in the embodiment of FIG. 1, and the distance X between the open end 16a of the signal conductor 16 and the end of the ground layer 5 is set to a length that corresponds to one-fourth the wavelength of the transmission signals, so that the signal conductor 16 works as a monopole antenna. In order to match impedances, the width of the linear conducting passage 6 is smaller than that of the passage 6 inside the cavity 3.

Figure 5:
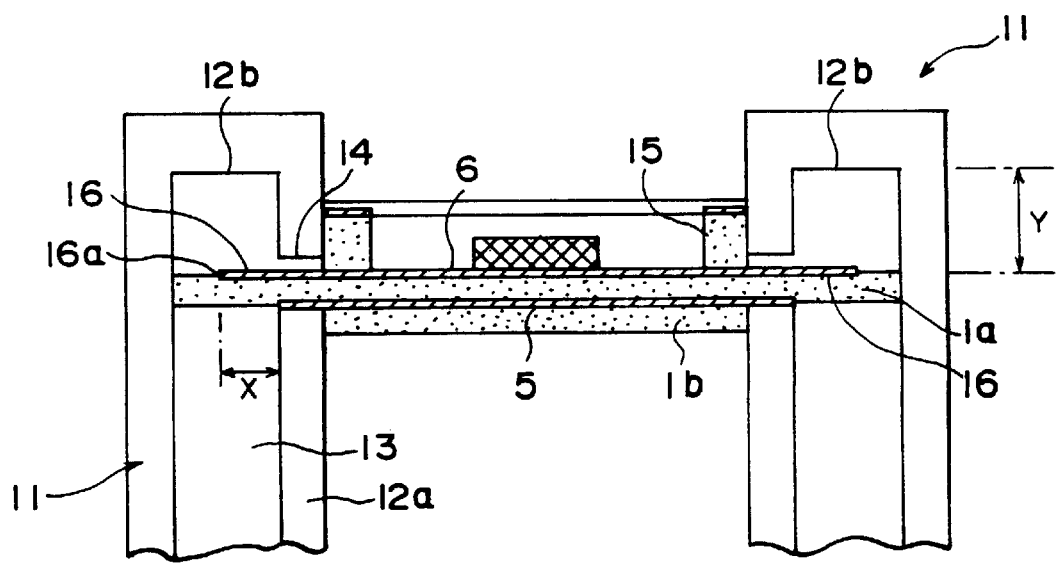
FIG. 5 is a diagram illustrating a structure for connecting the package of FIGS. 4A 4B to the waveguide.

Referring to FIG. 5 illustrating a structure for connecting the above-mentioned high-frequency package to the waveguide, the waveguide 11 has a structure quite the same as the one shown in FIG. 2. That is, an opening 14 is formed in the conductor wall 12a that serves as an H-plane for the high-frequency signals transmitted through the signal transmission space 13, and the signal conductor 16 is inserted in the signal transmission space 13 of the waveguide 11 through the opening 14. Besides, the waveguide 11 is adhered and secured to the dielectric layer 1a such that the conductor wall 12a of the side surface is intimately adhered to the lower dielectric layer 1b and to the dielectric frame 15.

The conductor wall 12a and the ground layer 5 are brazed together at the opening 14. Therefore, the conductor wall 12 of the waveguide and the ground layer 5 are maintained at the same potential.

According to this structure for connection, the signal conductor 16 works as a ¼ wavelength monopole antenna quite in the same manner as the above-mentioned structure for connection, and the high-frequency signals transmitted through the transmission space 13 of the waveguide 11 are converted through the signal conductor 16 into signals of a planar circuit formed on the dielectric layer 1a and are transmitted to the high-frequency element 4 through the microstrip line (c) (linear conducting passage 6). Therefore, the structure for connection of FIG. 5, too, makes it possible to transmit high-frequency signals from the waveguide with low loss without impairing the sealing of the cavity 3. Like the structure for connection using the package of FIG. 1, furthermore, the connection can be accomplished by forming an opening 14 at any position of the waveguide 11. When the connection is to be accomplished at an end of the waveguide 11, it is desired that the distance Y between an end surface (12b) of the signal transmission space 13 and the signal conductor 16 is set to a length that corresponds to one-fourth the wavelength of the transmission signals. It is further allowable to so accomplish the connection that the end surface (12b) of the signal transmission space 13 is perpendicular to the surface of the dielectric substrate 1 on which the signal conductor 16 is formed.

Figure 6:
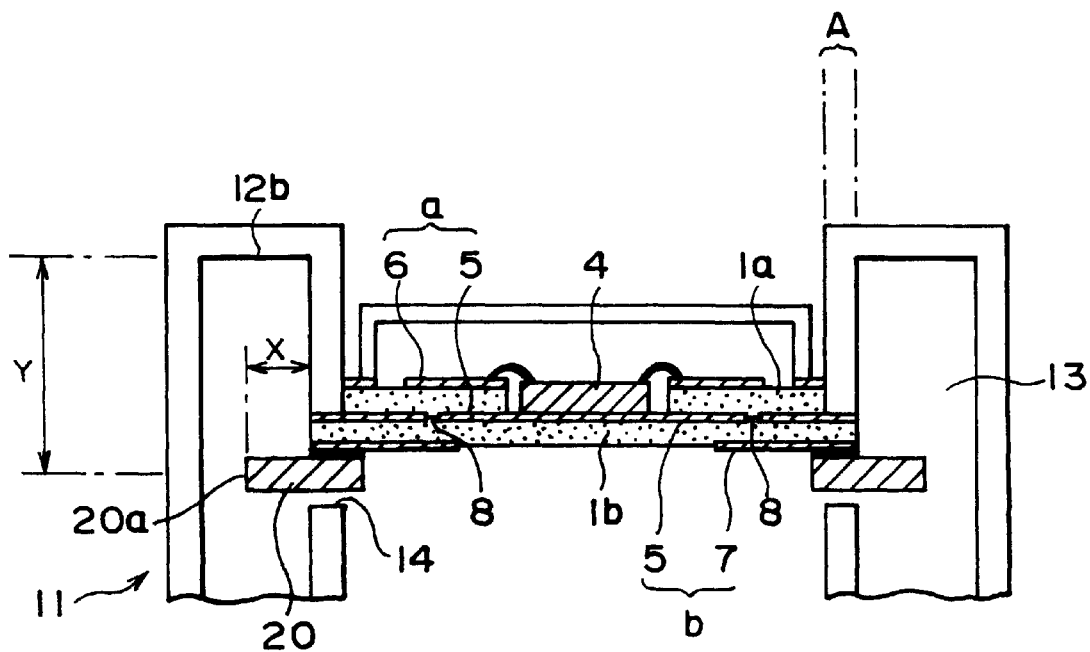
FIG. 6 is a diagram illustrating a further package of the linear conductor connection type by way of a structure for connection to the waveguide.

In the above-mentioned embodiment of FIGS. 1 to 5, the signal conductors 9 and 16 are formed integrally with the linear conducting passages 7 and 16. However, these signal conductors may be formed by using members separate from the linear conducting passages. FIG. 6 illustrates a structure for connection to the package of FIG. 1 of when the signal conductors are formed by using other members.

In the structure for connection of FIG. 6, the dielectric layer 1b is slightly extending outward to form a flange portion A, and the ground layer 5 on the upper surface of the dielectric layer 1b and the linear conducting passage 7 on the lower surface are both extending up to the end of the flange portion A (end of the dielectric layer 1b). At the end of the flange portion A, a pole-like conductor 20 is connected by brazing to the linear conducting passage 7. The pole-like conductor 20 is inserted in the transmission space 13 of the waveguide 11 attached to the flange portion A, and the distance X between the open end 20a of the pole-like conductor 20 and the ground layer 5 is set to a length equivalent to one-fourth the wavelength of the transmission signals. Moreover, the distance Y between the pole-like conductor 20 and the end surface (12b) of transmission space 13 of the waveguide 11 is set to a length equivalent to one-fourth the wavelength of the transmission signals. Therefore, the pole-like conductor 20 electromagnetically opened from the ground layer 5, effectively works as a ¼ wavelength monopole antenna, and transmits high-frequency signals sent through the transmission space 13 of the waveguide 11 to the high-frequency element 4 with a low loss through the pole-like conductor 20 and through the second microstrip line (b) and the first microstrip line (a) like the structure for connection shown in FIG. 2. In the structure for connection of FIG. 5, in particular, the flange portion A may have a size nearly equal to the thickness of the conductor wall 12 of the waveguide, offering an advantage in that the size of the dielectric substrate (dielectric layer 1b) can be decreased.

In the above-mentioned high-frequency package of the linear conductor connection type, the side surface of the waveguide has a structure of being connected to the package. It is, however, also allowable to employ such a structure in which the end surface of the waveguide serves as an open end which is connected. This embodiment will now be described with reference to FIGS. 7 to 11.

Figure 7A:
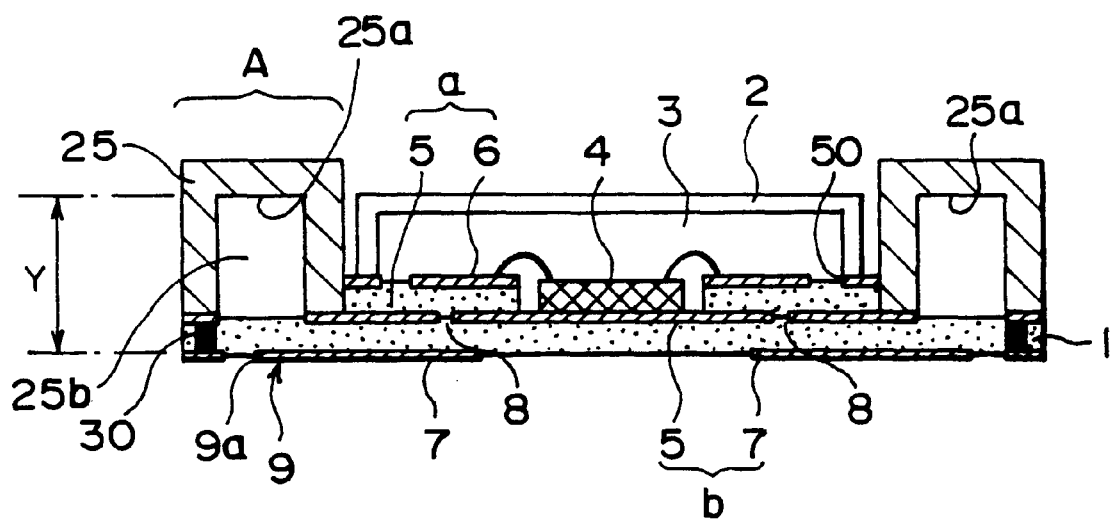
Figure 7B:
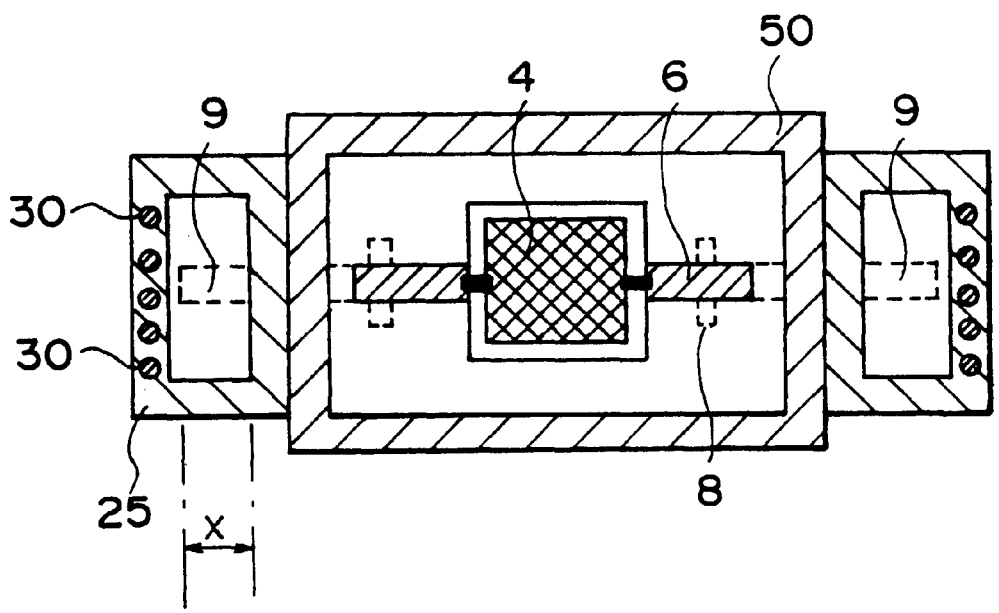

FIGS. 7A and 7B illustrate a high-frequency package (FIG. 7A is a side sectional view, and FIG. 7B is a plan view in a state where the closure is removed) having a basic structure which is quite the same as that of the package of FIG. 1. On the upper surface of the flange A (FIG. 7A), however, a waveguide terminating member 25 of the shape of a box with its lower surface being opened is secured to the ground layer 5 by brazing. That is, the recessed space 25b of the flange portion A is shut off from the outer side by the waveguide terminating member 25, thereby to form an end portion of signal transmission space of the waveguide.

Figure 8A:
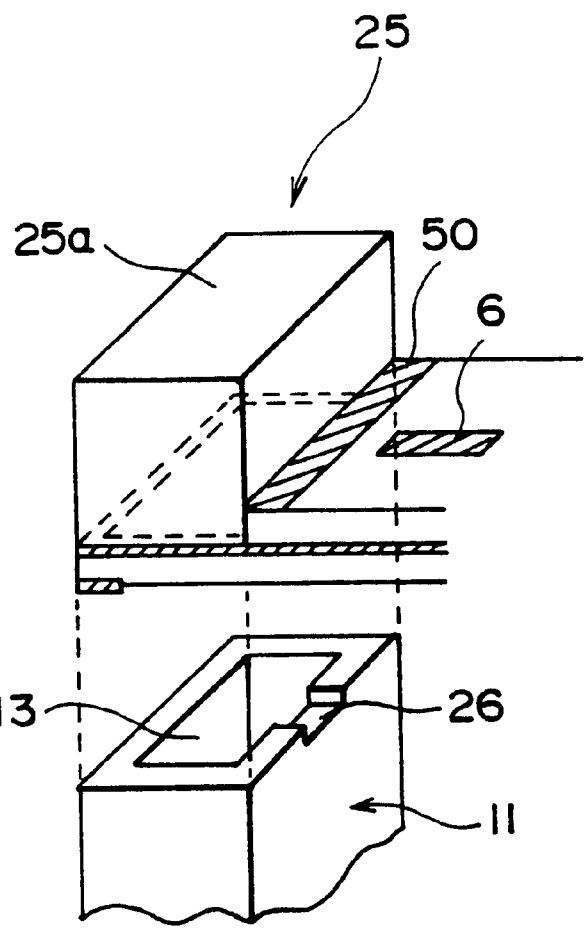
FIGS. 8A and 8B are diagrams illustrating a structure for connecting the package of FIGS. 7A and 7B to the waveguide.
Figure 8B:
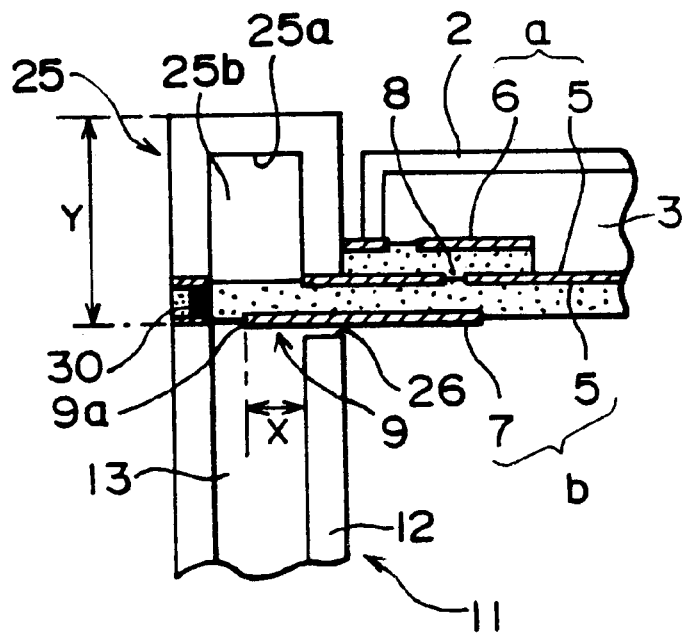

FIGS. 8A and 8B illustrate a structure for connecting the high-frequency package to the waveguide, and wherein FIG. 8A is a perspective view illustrating, in a disassembled manner, the structure for connecting the package to the waveguide, and FIG. 8B is a side sectional view illustrating major portions in the structure for connection. As will be obvious from FIGS. 8A and 8B, an end of the waveguide 11 is opened, and the open end is in match with an open portion at the lower end of the waveguide terminating member 25. That is, the open end of the waveguide 11 is adhered and secured by brazing to the lower surface of the flange portion A, whereby the signal transmission space 13 formed in the waveguide 11 is communicated with the recessed space 26 in the waveguide terminating member 25, and an upper end surface 25a of the waveguide terminating member 25 becomes an end surface of the signal transmission space 13. Moreover, a notch 26 is formed in the opened end of the waveguide 11 for inserting the signal conductor 9 formed on the linear conducting passage 7 of the package. The signal conductor 9 is inserted in the signal transmission space 13 through the notch 26. Like in the above-mentioned embodiment, the signal conductor 9 is not contacted to the conductor wall 12 of the waveguide 11 and, besides, the distance X between the inner surface of the conductor wall 12 and the open end 9a of the signal conductor 9 is set to a length equivalent to one-fourth the wavelength of the transmission signals. Accordingly, the signal conductor 9 works as a ¼ wavelength monopole antenna, and high-frequency signals are transmitted to the microstrip line (b) through the signal conductor 9, and are transmitted to the high-frequency element 4 through the microstrip line (a) electromagnetic coupled to the microstrip line (b) by the slot 8.

According to the above-mentioned structure for connection, the package and the waveguide 11 are connected together near the end of the signal transmission space 13. It is therefore desired that the distance Y between the signal conductor 9 and the upper end surface 25a of the waveguide terminating member 25 (end of the signal transmission space 13) is set to a length equal to one-fourth the wavelength of the transmission signals. It is further desired that the ground layer 5 is extended to the peripheral edge of the flange portion A, the conductor wall of the waveguide terminating member 25 is electrically connected to the ground layer 5, a plurality of via-hole conductors 30 are provided maintaining a suitable gap at the end portion of the flange portion A and the portion connected to the waveguide terminating member 25, and the waveguide 11 and the waveguide terminating member 25 are electrically connected together. Therefore, the waveguide 11 and the waveguide terminating member 25 are maintained at the same potential as the ground layer 5 and, besides, a false conductor wall is formed by the via-hole conductors 30 at a portion where the two are connected together, making it possible to effectively preventing the leakage of electromagnetic waves at the connection portion.

Figure 9:
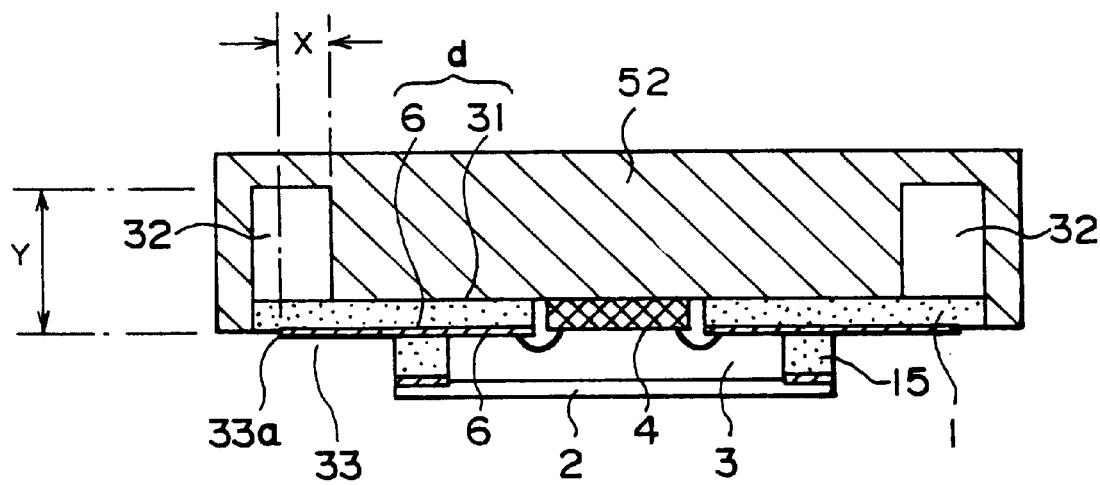
FIG. 9 is a diagram illustrating a still further package of the linear conductor connection type equipped with the waveguide terminating member.

High-frequency packages of various structures can be prepared by utilizing the structure of the above-mentioned waveguide terminating member 25. In a package of FIG. 9, for example, a dielectric frame 15 is formed on one surface of the dielectric substrate 1 so as to surround the high-frequency element 4 like the package shown in FIGS. 4A and 4B, and the closure 2 is brazed to the upper end of the dielectric frame 15. Thus, the high-frequency element 4 is sealed in the cavity 3 formed by the closure 2. Moreover, a linear conducting passage 6 is formed on the surface of the dielectric substrate 1 penetrating through the dielectric frame 15, and an end of the linear conducting passage 6 is connected to the high-frequency element 4. A conductor block 52 that is grounded is adhered and secured to the other surface of the dielectric substrate 1. That is, the interface between the conductor block 30 and the dielectric substrate 1 serves as a ground surface 31, and the ground surface 31 and the linear conducting passage 6 together form a microstrip line (d) that extends toward the inside and outside of the cavity 3. In this embodiment of the invention, recessed portions 32 are formed in the peripheral edges of the conductor block 52. That is, if the waveguide is so connected that the recessed portion 32 matches with the signal transmission space in the waveguide, high-frequency signals can be transmitted quite in the same manner as in the above-mentioned structure for connection shown in FIGS. 8A and 8B. In the package of FIG. 9, therefore, the linear conducting passage 6 is so formed as to protrude over the recessed portion 32 of the conductor block 52, and this protruded portion 33 is electromagnetically opened and works as a signal conductor. That is, the distance X between the open end 33a of the protruded portion 33 and the inner surface of the recessed portion 32 is set to a length equal to one-fourth the wavelength of the transmission signals and, whereby the protruded portion 33 that has infiltrated into the signal transmission space of the waveguide that is connected works as a ¼ wavelength monopole antenna. In this case like in the above-mentioned embodiment, it is desired that the distance Y between the protruded portion 33 and the bottom surface 32a of the recessed portion 32 (upper end surface in FIG. 9) is set to a length equal to one-fourth the wavelength of the transmission signals. It is further desired to provide via-hole conductors 35 at the end portion of the dielectric substrate 1 to electrically connect the waveguide and the conductor block 52 together. It is, however, also possible to extend the end of the conductor block 52 so as to be brought into direct contact with the open end of the waveguide. Moreover, the conductor block 52 may be comprised of a conductor layer such as a metal layer formed on the surface of the dielectric block. In this case, the conductor layer may be formed only in the recessed portion 32 and on the portion that becomes the ground surface 31.

Even when the interior of the waveguide terminating member 25 used for the package of FIGS. 7A and 7B is filled with a dielectric material, the waveguide can be connected in the same manner. When the waveguide terminating member is constituted as described above, there is obtained an advantage in that the dielectric substrate and the waveguide terminating member can be fabricated at one time by firing the so-called ceramic and the conducting layer simultaneously. The thus formed structure for connecting the package to the waveguide is shown in FIGS. 10 and 11.

Figure 10:
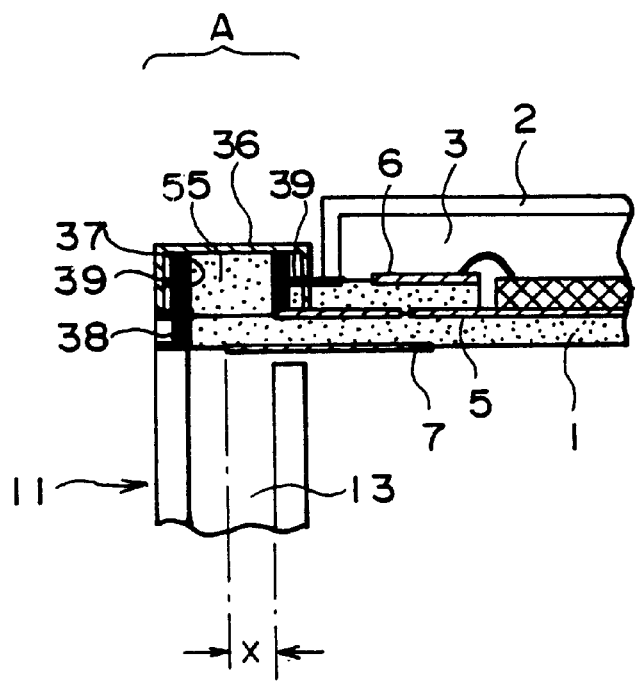
FIGS. 10 and 11 are diagrams illustrating yet further packages of the linear conductor connection type equipped with the waveguide terminating member by way of a structure for connection to the waveguide.

The package of FIG. 10 basically has the same structure as the package of FIGS. 7A and 7B, but has a dielectric block 55 that is adhered and secured onto the dielectric substrate 1 (dielectric layer 1b) of the flange portion A with an organic adhesive or the like. A metal layer 36 is formed on the exposed surface of the dielectric block 55 and extends up to the end of the dielectric substrate 1. Moreover, a pulurality of via-hole conductors 37 are provided in the dielectric block 55 so that the electromagnetic waves cannot leak, and space partitioned by the via-hole conductors 37 matches with the signal transmission space 13 in the waveguide 11. Therefore, this space becomes a terminating portion of the signal transmission space 13. In this case, in order to prevent the leakage of electromagnetic waves from the portion of connection, it is desired that the via-hole conductor 38 is provided in the end portion of the dielectric substrate 1, too, to be in match with the signal transmission space 13, and a horizontal conductor 39 is provided in the dielectric block 55 to meet at right angles with the via-hole conductors 37.

Figure 11:
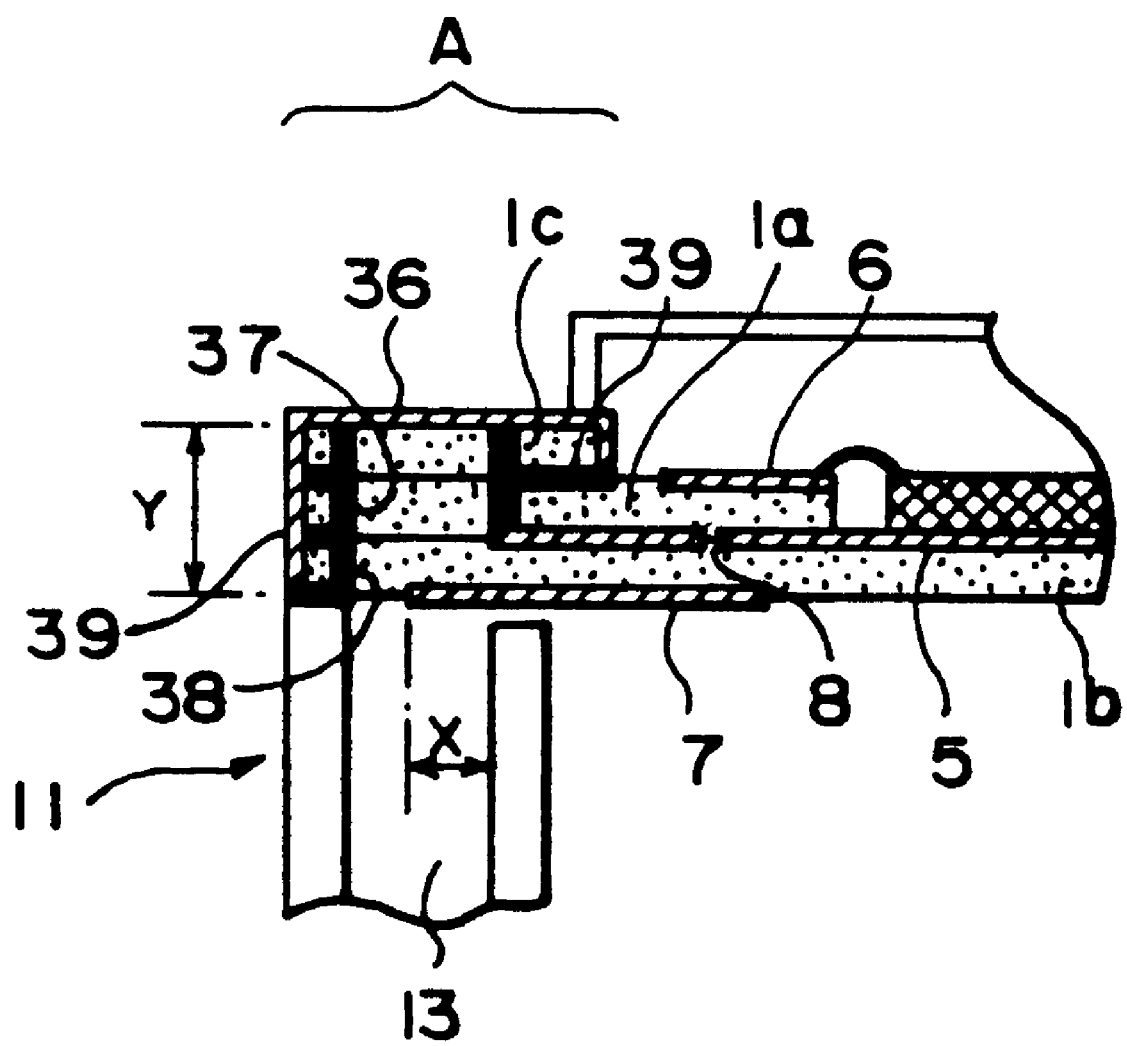

In the package of FIG. 11, furthermore, the upper dielectric layer 1a outwardly protrudes together with the lower dielectric layer 1b to form a flange portion A and, besides, a dielectric layer 1c is laminated thereon. That is, the flange portion A has a structure in which the dielectric layers 1a to 1c are laminated one upon the other, and the upper exposed surface of the flange portion A having the laminated structure is covered with the metal layer 36 in the same manner as shown in FIG. 10. Moreover, the flange portion A is equipped with the via-hole conductors 37 and 38 like in FIG. 10, and these via-hole conductors form a space that matches with the signal transmission space 13 in the waveguide 11. This space becomes a terminating portion of the signal transmission space 13. In this embodiment, too, therefore, it is desired to provide the horizontal conductor 39 in order to prevent the leakage of electromagnetic waves from the portion of connection.

In FIGS. 10 and 11, too, the signal conductor (linear conducting passage 7) provided in the package extends into the signal transmission space 13 in the waveguide 11 to work as a ¼ wavelength monopole antenna. Like in the above-mentioned embodiments, therefore, the distances X and Y are set to a length equal to one-fourth the wavelength of the transmission signals. As a dielectric material for forming the waveguide terminating structure, e.g., as the dielectric block or as the dielectric layers, it is desired to use a material having a dielectric constant which is not larger than 10.

In the foregoing was described the package of the linear conductor connection type with reference to FIGS. 1 to 11. Next, described below is a package of the ground layer connection type.

Figures 12A, 12B:
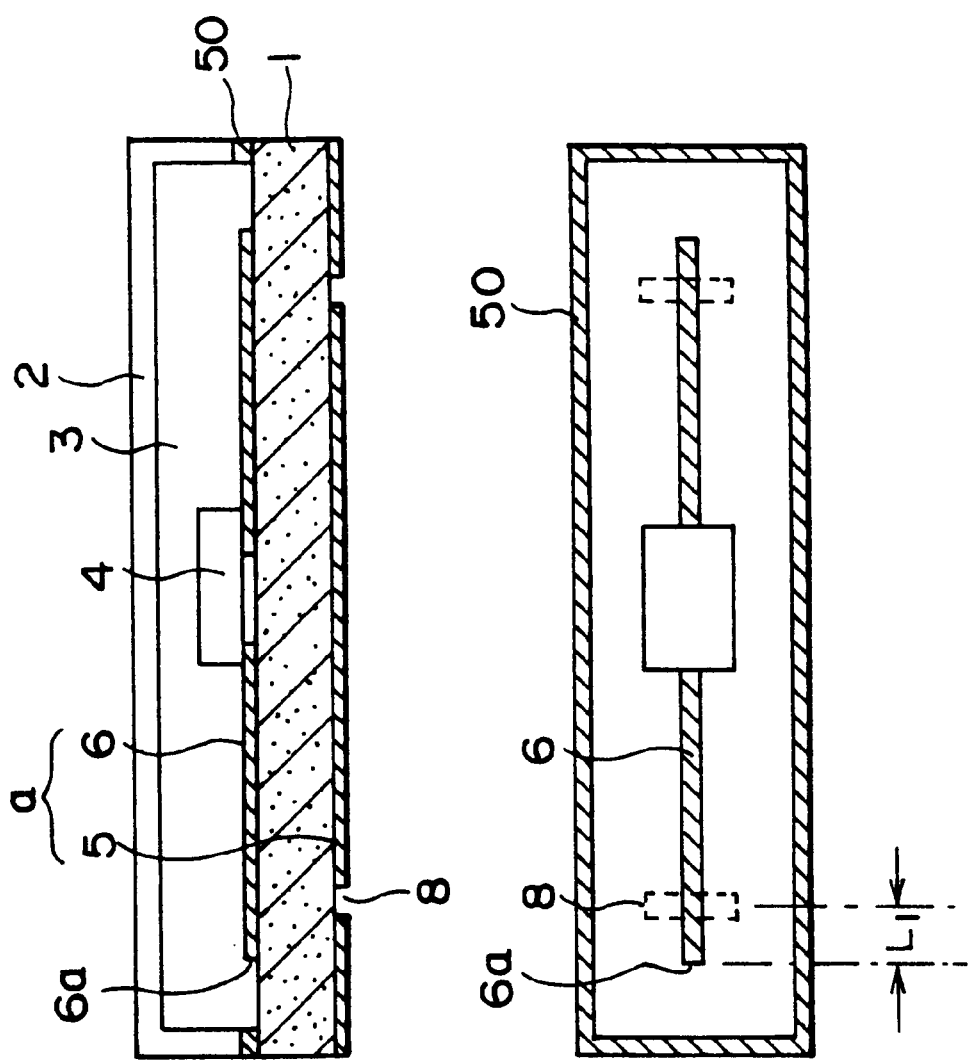

Referring to FIGS. 12A and 12B illustrating the most basic structure of the package of the ground layer connection type of the present invention (FIG. 12A is a side sectional view of the package, and FIG. 12B is a plan view of the package in a state where the closure is removed), a linear conducting passage 6 is provided on the upper surface of the dielectric substrate 1, a high-frequency element 4 is directly mounted on the linear conducting passage 6, and the linear conducting passage 6 and the high-frequency element 4 are electrically connected together. Moreover, a closure 2 (FIG. 12A) is brazed (50) onto the upper surface of the dielectric substrate 1, and the high-frequency element 4 is sealed in a cavity 3 formed by the closure 2. On the other hand, a ground layer 5 is formed on the bottom surface of the dielectric substrate 1, a microstrip line (a) is formed by the ground layer 5 and the linear conducting passage 6, and high-frequency signals are transmitted to the high-frequency element 4 through the microstrip line (a) (FIG. 12A) which is a transmission line. The closure and the dielectric substrate 1 may be adhered together with a glass or an organic adhesive.

In the present invention, a slot 8 is formed in the ground layer 5, and a waveguide is connected to a portion where the slot 8 is formed. That is, the signal transmission passage formed by the waveguide and the microstrip line (a) formed in the package are electromagnetically coupled together through the slot 8, and high-frequency signals are transmitted from the waveguide to the high-frequency element 4 through the microstrip line (a). This structure for connection, too, makes it possible to transmit high-frequency signals with low loss without at all affecting the sealing of the cavity 3 quite like that of the above-mentioned embodiments of FIGS. 1 to 11. As described in detail with reference, particularly, to FIGS. 1A and 1B, therefore, the distance $L_1$ between the end 6a of the linear conducting passage 6 and the center of the slot 8 is set to a length equal to one-fourth the wavelength of the transmission signals in the package of FIGS. 12A and 12B, too. Moreover, the slot 8 may assume the shape of a dogbone. It is further allowable to provide via-hole conductors connected to the ground layer 5 so as to surround the slot 8.

FIGS. 13A, 13B and 14A, 14B illustrate a structure for connecting the above-mentioned package to the waveguide.

Figure 13A:
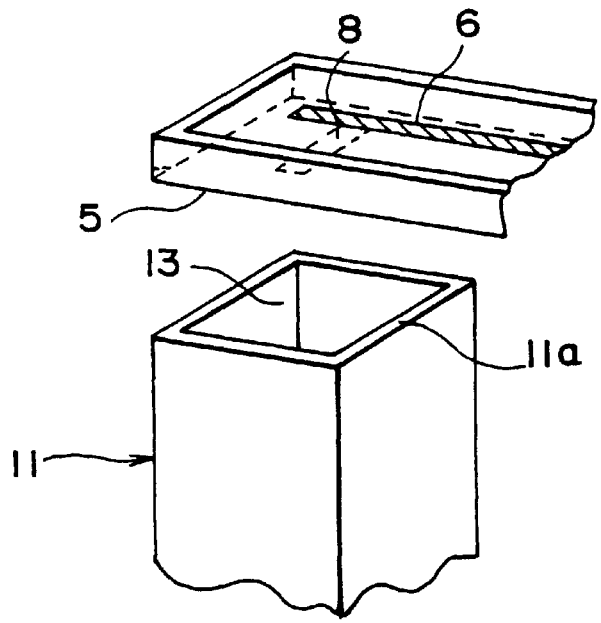
FIGS. 13A and 13B are diagrams illustrating a structure for connecting the package of FIGS. 12A and 12B to the waveguide.
Figure 13B:
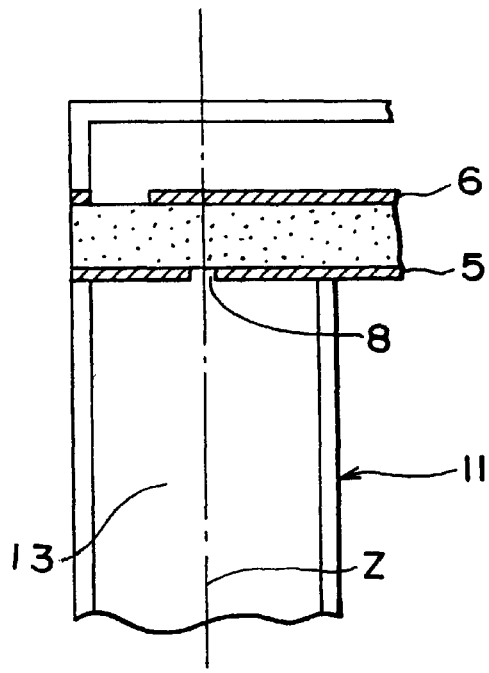

FIGS. 13A and 13B illustrate an embodiment in which an end of the waveguide is connected, wherein FIG. 13A is a perspective view illustrating the structure for connection in a disassembled manner and FIG. 13B is a side sectional view of the structure for connection. In FIGS. 13A and 13B, an end 11a of the waveguide 11 is opened, and the above-mentioned package is connected to the open end 11a. That is, as clearly shown in FIG. 13B, the open end 11a of the waveguide 11 is adhered and secured to the ground layer 5, and the slot 8 formed in the ground layer 5 is located on a z-axis which is the center of the signal transmission space 13 formed in the waveguide 11. Therefore, the ground layer 5 maintains a positional relationship that intersects the z-axis perpendicularly, and forms an end surface of the signal transmission space 13.

Figure 14A:
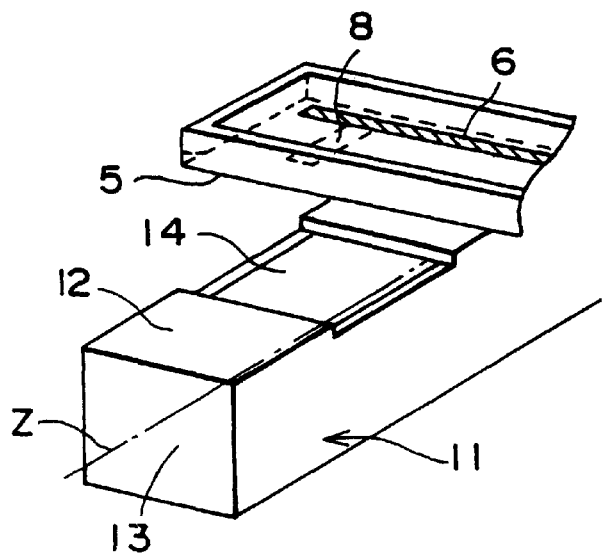
FIGS. 14A and 14B are diagrams illustrating another structure for connecting the package of FIGS. 12A and 12B to the waveguide.
Figure 14B:
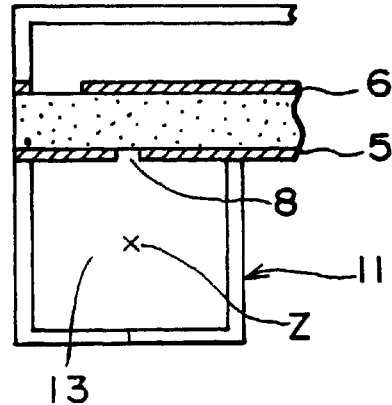

FIGS. 14A and 14B illustrate an embodiment in which the side surface of the waveguide is connected, and wherein FIG. 14A is a perspective view illustrating the structure for connection in a disassembled manner and FIG. 14B is a side sectional view of the structure for connection. In FIGS. 14A and 14B, an opening 14 is formed in the side wall 12 of the waveguide 11, and the above-mentioned package is adhered and secured to the opening 14. That is, the slot 8 formed in the ground layer 5 is located to face the z-axis which is the center of the signal transmission space 13 in the waveguide 11, and the ground layer 5 forms the side surface of the signal transmission space 13.

In the above-mentioned structure for connection of FIGS. 13A, 13B and 14A, 14B, it will be understood that the ground layer 5 works as a conductor wall (electromagnetic wave shut-off wall) that defines the signal transmission space 13, high-frequency signals transmitted through the transmission space 13 are transmitted to the microstrip line (a) based on the electromagnetic coupling through the slot 8, and are further transmitted to the high-frequency element 4.

Figure 15A:
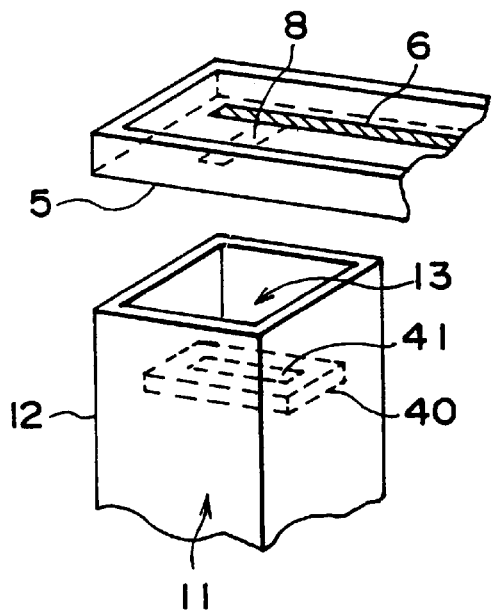
FIGS. 15A and 15B are diagrams illustrating a preferred waveguide used for the structure for connection shown in FIGS. 13A and 13B.
Figure 15B:
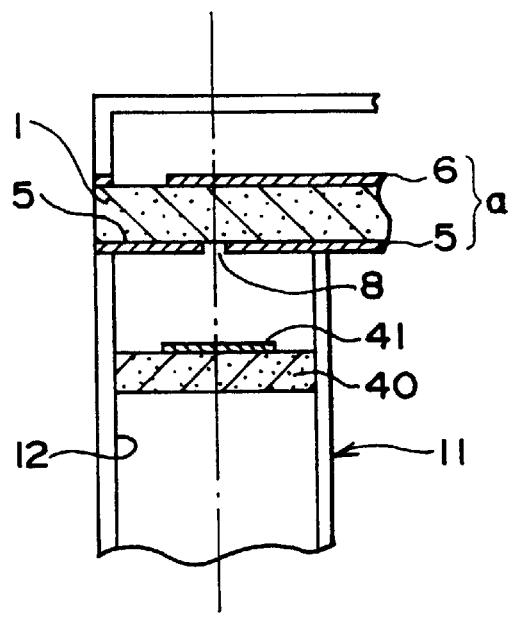
Figure 16A:
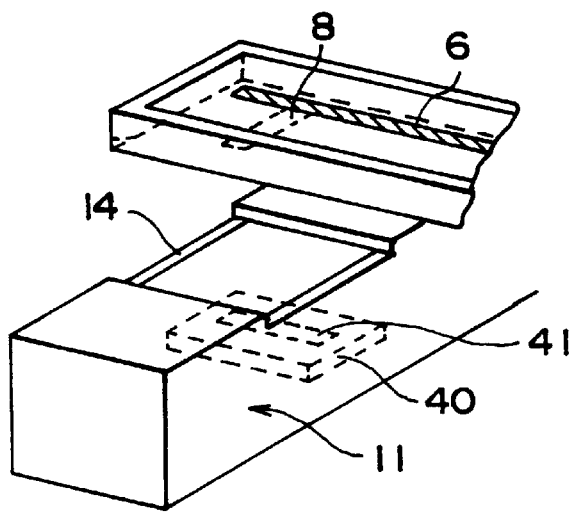
FIGS. 16A and 16B are diagrams illustrating a preferred waveguide used for the structure for connection shown in FIGS. 14A and 14B.
Figure 16B:
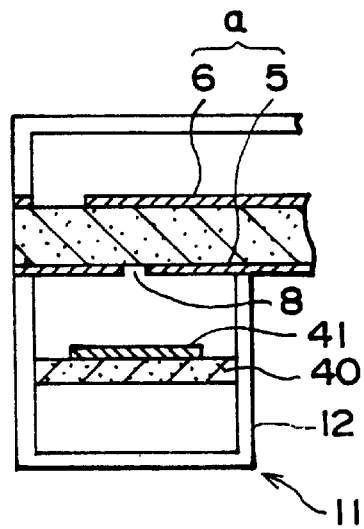

In the case of the package shown in FIG. 14A and 14B, the linear conducting layer which works as the so-called dipole antenna is provided in the waveguide in order to intensify the electromagnetic coupling between the waveguide 11 and the package. FIGS. 15A and 15B are a disassembled perspective view and a side sectional view of when the waveguide used for the structure for connection shown in FIGS. 13A and 13B is provided with the above-mentioned linear conducting layer, and FIGS. 16A and 16B are a disassembled perspective view and a side sectional view of when the waveguide used for the structure for connection shown in FIGS. 14A and 14B is provided with the above-mentioned linear conducting layer. As shown in these drawings, a dielectric plate 40 is provided in the signal transmission space 13 in the waveguide 11 inscribing the inner surface of the conductor wall 12 of the waveguide 11, and a linear conducting layer 41 is formed on the dielectric plate 40 being opposed to the slot 8 and in parallel with the ground layer 5. Both ends of the linear conducting layer 41 is electromagnetically opened and their lengths are set to be equal to one-half the wavelength of the transmission signals. In these embodiments, therefore, the linear conducting layer 41 works as a dipole antenna, the electromagnetic coupling is further enhanced between the signal transmission space 13 and the microstrip line (a) in the package, and high-frequency signals are transmitted to the high-frequency element 4 with low loss without deteriorating the sealing of cavity 3 in the package.

Figure 17A:
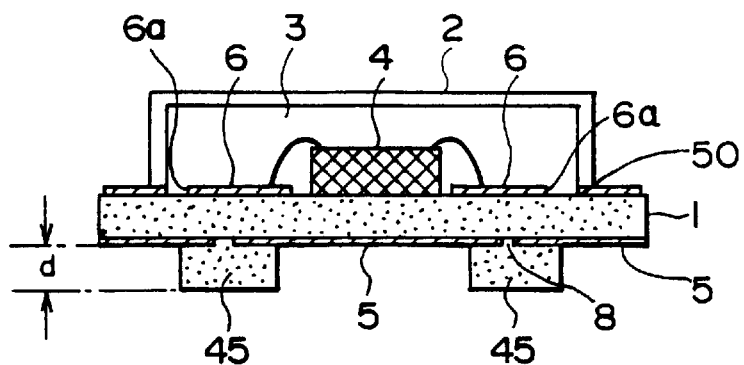
FIGS. 17A, 17B and 17C are diagrams illustrating a package of the ground layer connection type equipped with a dielectric member for matching the impedance, and a structure for connecting the package to the waveguide.
Figure 17B:
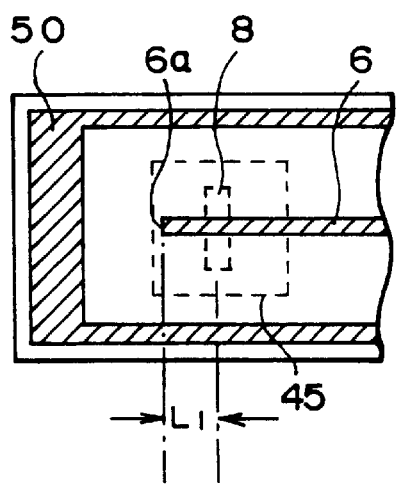
Figure 17C:
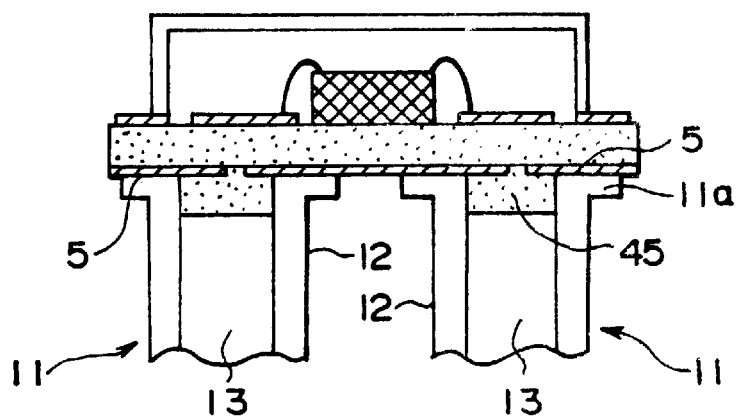

In the above-mentioned package of the ground layer connection type, the slot formed in the ground layer can be covered with a dielectric member for matching the impedance to connect the waveguide in this state. This embodiment is shown in FIGS. 17A, 17B and 17C. FIG. 17A is a side sectional view of the package equipped with such a dielectric member for matching the impedance, FIG. 17B is a plan view illustrating major portions of the dielectric substrate in the package, and FIG. 17C is a diagram illustrating a state where the package and the waveguide are connected together.

In FIGS. 17A, 17B and 17C, the package has a structure substantially the same as that of the package shown in FIGS. 12A and 12B except that the slot 8 in the ground layer 5 is provided with a dielectric block 45 for matching the impedance. In FIG. 17A, for example, the high-frequency element 4 is connected to the linear conducting passage 6 by bonding a wire. However, the high-frequency element 4 may be connected to the linear conducting passage 6 by ribbons or by being directly mounted thereon like in the package of FIGS. 12A and 12B.

Figure 18:
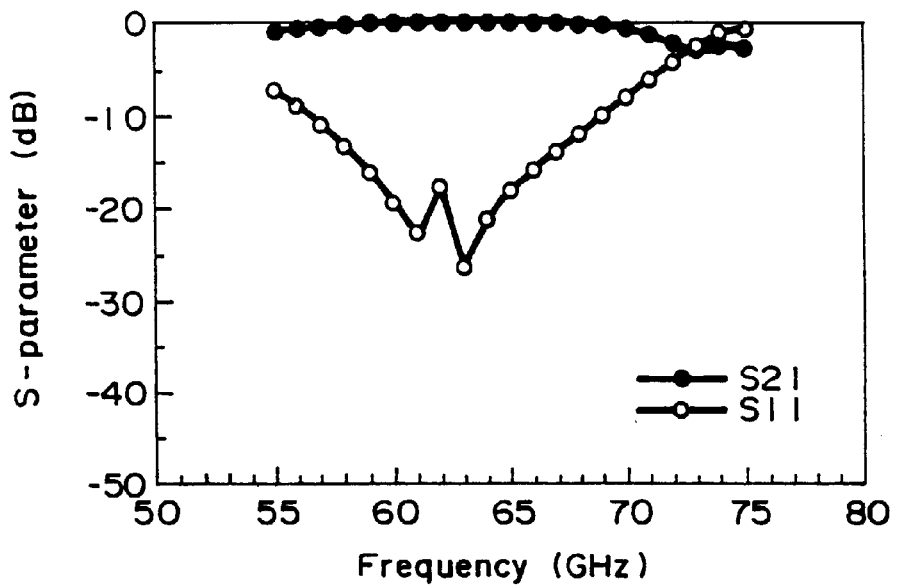
FIG. 18 is a diagram illustrating the results of evaluating high-frequency transmission characteristics of the connection structure shown in FIG. 17C relying upon a finite element method.

In this package, the dielectric block 45 is formed in a size that matches with the signal transmission space 13 in the waveguide 11, and is fitted in the signal transmission space 13 in the waveguide 11 mounted on the ground layer 5 (see FIG. 17C). The dielectric block 45 has a thickness d which is equal to one-fourth the wavelength of the transmission signals. That is, since the slot 8 has an impedance different from an impedance of the signal transmission space 13 in the waveguide 11, the dielectric block 45 is provided to bring their impedances into match with each other, so that signals can be transmitted more favorably through the slot 8. FIG. 18 shows the results of evaluation of the transmission characteristics of high-frequency signals through the structure for connecting the package to the waveguide based on the finite element method. It will be understood from FIG. 18 that the signals having a frequency of 60 GHz are favorably transmitted exhibiting S21 (loss) of 0 dB and S11 (reflection) of −20 dB.

Figure 19:
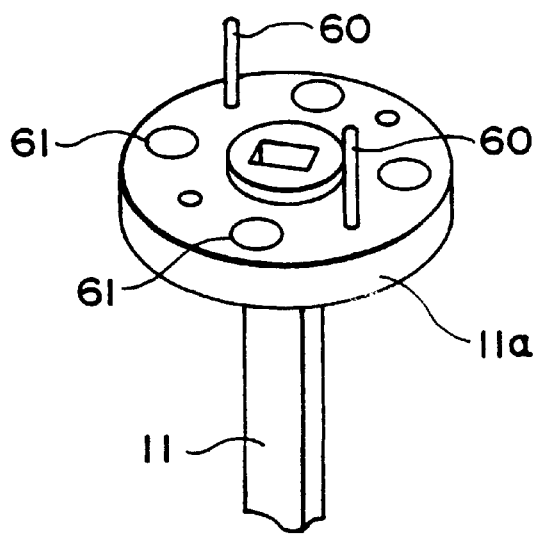
FIG. 19 is a diagram illustrating, on an enlarged scale, the structure at an open end of the waveguide that is favorably used for being connected to the package.

In the above-mentioned package, furthermore, it is desired that a flange portion 11a is formed at the open end of the waveguide 11. By providing such a flange portion 11a, the open end of the waveguide 11 can be easily joined to the ground layer 5 by brazing or by using a screw. FIG. 19 illustrates a preferred example of the open end of the waveguide 11 equipped with the flange portion 11a. As will be obvious from FIG. 19, the flange portion 11a formed at the open end of the waveguide 11 is provided with positioning pins 60 and threaded holes 61. By providing the dielectric substrate and the ground layer of the package with holes corresponding to these positioning pins and threaded holes, it becomes easy to join the waveguide and the package together. That is, the open end of the waveguide is positioned by inserting the positioning pins in the predetermined holes formed in the ground layer and in the dielectric substrate, and, in this state, predetermined screws are inserted from the side of the dielectric substrate to fasten the flange portions 11a of the waveguide to the ground layer 5 by screws.

In the embodiment of FIGS. 17A, 17B and 17C the waveguide 11 is directly connected to the ground layer 5. However, the waveguide 11 may be connected to the ground layer 5 through a suitable connection fitting. This embodiment is shown in FIGS. 20A, 20B and 20C, wherein FIG. 20A is a side sectional view of the package equipped with such a connection fitting, FIG. 20B is a plan view illustrating major portions of the dielectric substrate of the package, and FIG. 20C is a diagram illustrating a state where the package and the waveguide are connected together.

Figure 20A:
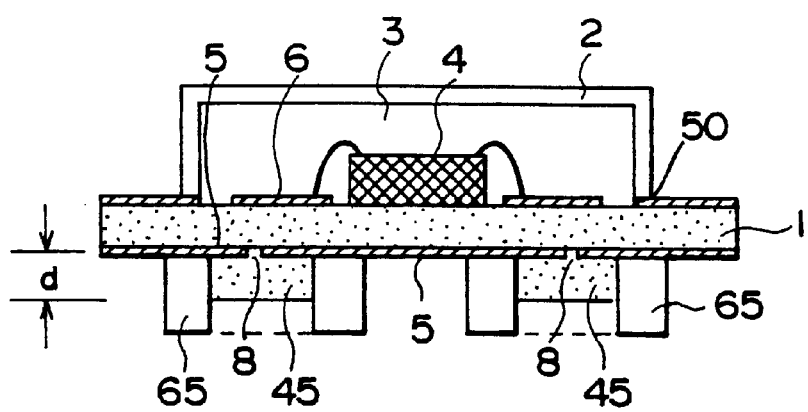
FIGS. 20A, 20B and 20C are diagrams illustrating the package shown in FIG. 17A equipped with a waveguide connection member.
Figure 20B:
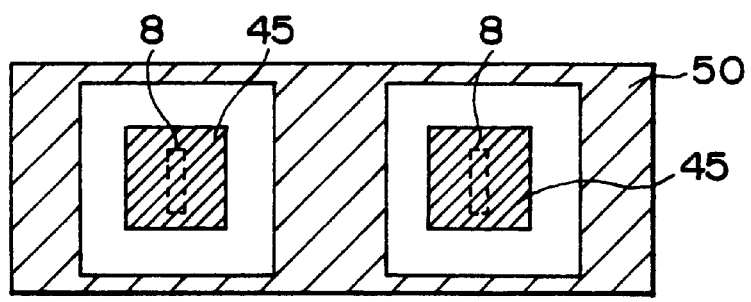
Figure 20C:
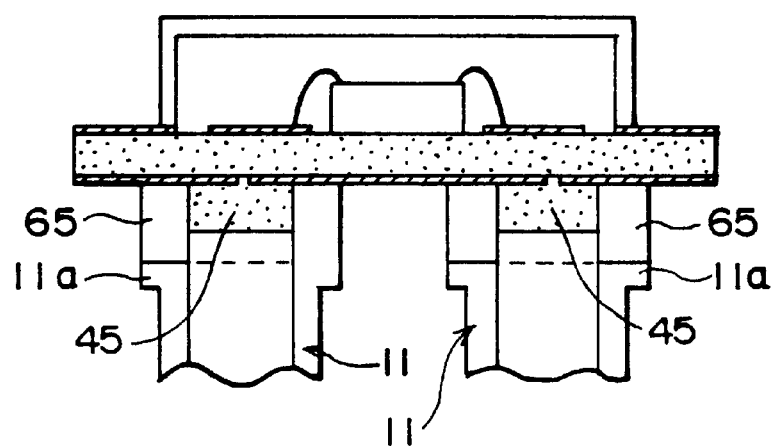

As will be obvious from FIG. 20A, the package is the same as the package of FIG. 17A but is equipped with a connection fitting 65. The connection fitting 65 is made of a metal and has the shape of a frame which is intimately adhered to the surrounding of the dielectric block 45, and is stuck to the ground layer 5. The metallic connection fitting having such a shape forms therein a space for transmitting signals. As shown in FIG. 20C, therefore, upon joining the open end of the waveguide 11 to the end of the connection fitting 35, there is realized a structure for connection quite the same as that of FIG. 17C. In FIG. 20C, the two dielectric blocks 45 are separately provided with the metallic connection fittings 65. These connection fittings 65, however, may be formed as a unitary structure. That is, a metal having a large area and having a cavity corresponding to the dielectric block 45 can be used as a metallic connection fitting. In this case, the area for connection to the open end of the waveguide can be increased, offering an advantage from the standpoint of using a waveguide equipped with the flange portion 11a as shown, for example, in FIG. 19.

According to the present invention, furthermore, the dielectric layer can be used as a dielectric member for matching the impedance. That is, the above-mentioned dielectric block 45 can be adhered and secured to the ground layer 5 of the dielectric substrate 1 with a suitable adhesive agent involving, however, a problem of an increase in the number of steps for production. When ceramic is used as the dielectric substrate 1, furthermore, the ground layer 5 and the linear conducting passage 6 are applied by printing onto the dielectric substrate 1 that has not been fired yet, the dielectric block 45 that has not been fired yet is stuck thereto with an adhesive, followed by firing simultaneously to produce the package. In this case, however, there remains a problem in that the dielectric block falls during the firing. When the dielectric member for matching the impedance is formed by the dielectric layer, however, there arises no problem of the member falling off and the package can be produced based on the method of simultaneous firing offering a great advantage from the standpoint of production.

Figure 21A:
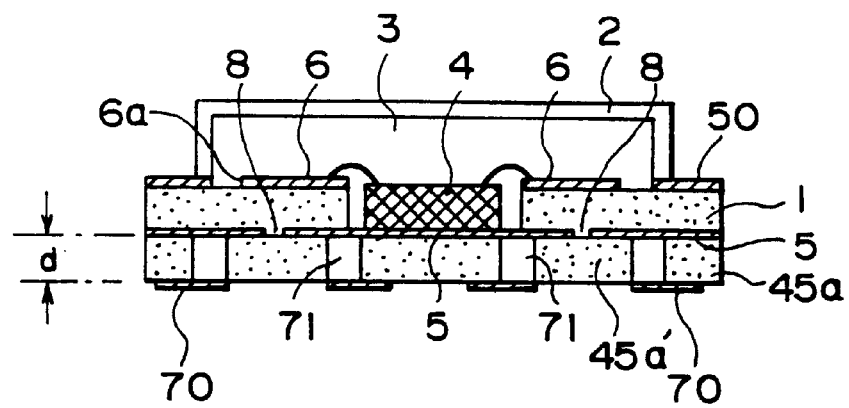
FIGS. 21A, 21B and 21C are diagrams illustrating a package of the ground layer connection type equipped with a dielectric layer for matching the impedance, and a structure for connecting the package to the waveguide.
Figure 21B:
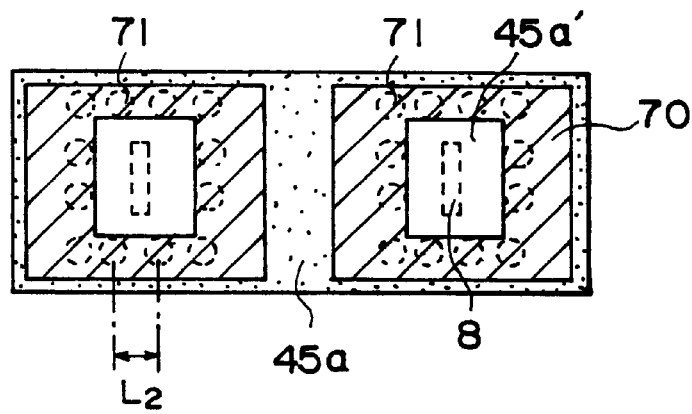
Figure 21C:
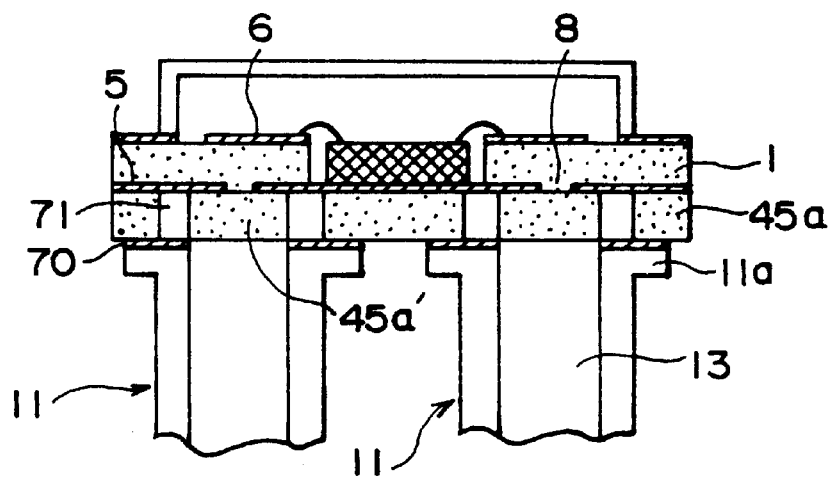

FIGS. 21A, 21B and 21C illustrate a package having a dielectric layer as a dielectric member for matching the impedance and a structure for connecting the package to the waveguide. That is, FIG. 21A is a side sectional view of the package, FIG. 21B is a bottom view of the dielectric substrate in the package, and FIG. 21C is a side sectional view illustrating a structure for connecting the package to the waveguide.

Referring to FIG. 21A, a dielectric layer 45a having a thickness same as that of the above-mentioned dielectric block 45 is laminated on the dielectric substrate 1 of the package via the ground layer 5, and a frame-like metal layer 70 is formed on the surface of the dielectric layer 45a. A number of via-hole conductors 71 are provided along the inner peripheral edges of the frame-like metal layer 70, and the frame-like metal layer 70 and the ground layer 5 are electrically connected together through the via-hole conductors 71. As will be understood from FIGS. 21B and 21C, in particular, the waveguide 11 is connected with its flange portion 11a being adhered to the metal layer 70, the slot 8 formed in the ground layer 5 is located at the center of the space 45a closed by the via-hole conductors 71, and this space 45a matches with the signal transmission space 13 formed in the waveguide 11. Therefore, the via-hole conductors 71 serve as a false conductor wall, the signal transmission space 13 protrudes beyond the open end of the waveguide 11 and terminates at the ground layer 5, and a dielectric layer 45a in the space 45a' closed by the via-hole conductors 71 works as a dielectric member for matching the impedance quite in the same manner as the above-mentioned dielectric block 45. Even relying upon this structure for connection, high-frequency signals can be efficiently transmitted between the waveguide 11 and the package, and the waveguide 11 is maintained at the same potential as the ground layer 5. It is desired that a distance $L_2$ among the via-hole conductors 71 is set to a length not larger than one-fourth the wavelength of the transmission signals in order to effectively prevent the leakage of electromagnetic signals from the space 45a'.

Figure 22A:
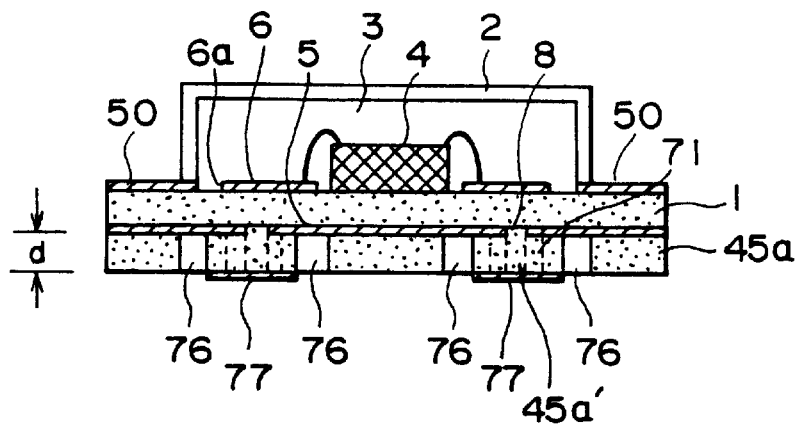
FIGS. 22A, 22B and 22C are diagrams illustrating a further package of the ground layer connection type equipped with the dielectric layer for matching the impedance.
Figure 22B:
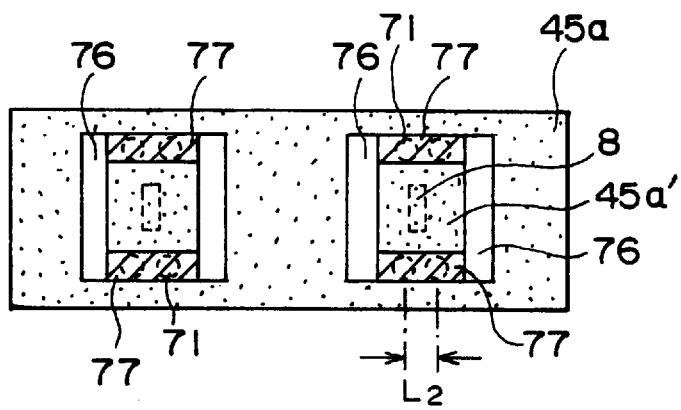
Figure 22C:
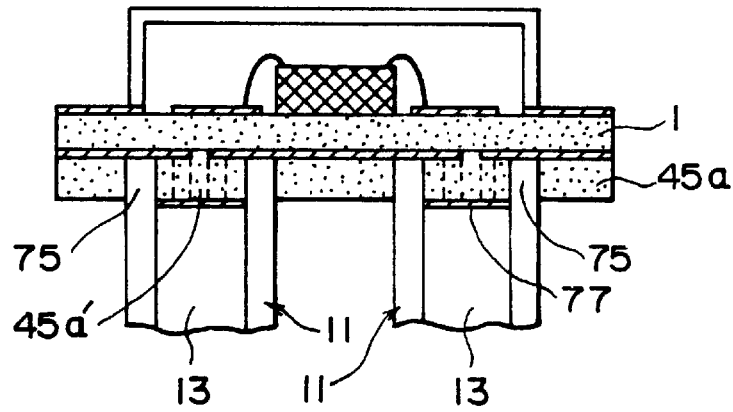
Figure 23:
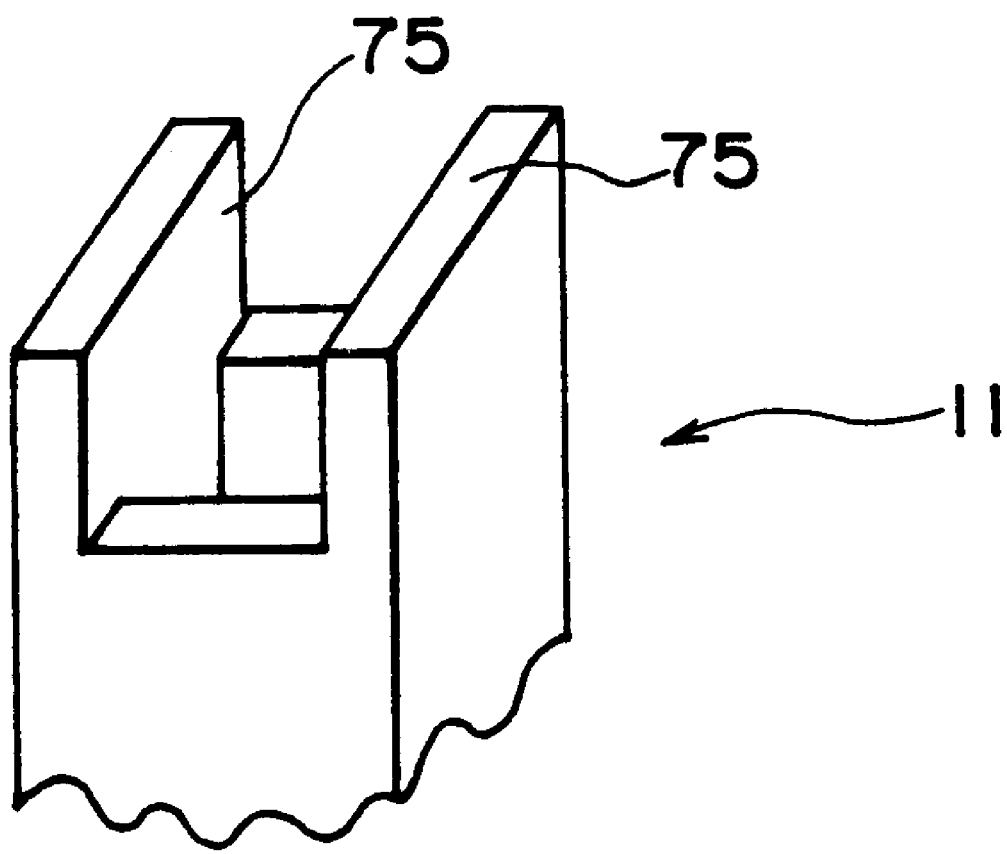
FIG. 23 is a diagram illustrating an open end of the waveguide connected to the package shown in FIGS. 22A to 22C.

In the package in which the above-mentioned dielectric layer 45a is laminated on the dielectric substrate 1, an opening is formed in the dielectric layer 45a so that the waveguide is inserted therein and is stably connected. FIGS. 22A, 22B and 22C illustrate the above-mentioned package and a structure for its connection. That is, FIG. 22A is a side sectional view of the package, FIG. 22B is a bottom view of the dielectric substrate of the package, and FIG. 22C is a side sectional view illustrating the structure for connecting the package to the waveguide. FIG. 23 is a perspective view of the open end of the waveguide that is connected to the package.

At the open end of the waveguide 11 connected to the package as will be obvious from FIG. 23, a pair of opposing conductor walls protrude to form protrusions 75, for insertion. In the package as shown in FIGS. 22A and 22B, on the other hand, a pair of openings 76 for insertion are formed in the dielectric layer 45a laminated on the dielectric substrate 1 so as to sandwich the slot 8 formed in the ground layer 5. That is, as shown in FIG. 22C, the protrusions 75 formed at the open end of the waveguide 11 are inserted in the openings 76 in the package, and the waveguide 11 is secured in such a manner that an end thereof comes into contact with the ground layer 5. In this case, a pair of metal layers 77 are formed on the surface of the dielectric layer 45a so as to be communicated with both ends of the openings 76, 76 for insertion, a portion at the open end where the protrusions 75 are not formed of the waveguide 11 are brought into contact with the metal layers 77, and the metal layers 77 and the ground layer 5 are electrically connected together through a plurality of via-hole conductors 71. This makes it possible to effectively prevent the leakage of electromagnetic waves from the joined portion. In this case, too, it is desired that the distance $L_2$ among the via-hole conductors 71 is set to be not larger than one-fourth the wavelength of the transmission signals. The dielectric layer 45a in the space 45a' defined by the via-hole conductors 77 and the protrusions 75 of the waveguide 11 that is inserted, works as a dielectric member for matching the impedance enabling high-frequency signals to be efficiently transmitted.

Figure 24A:
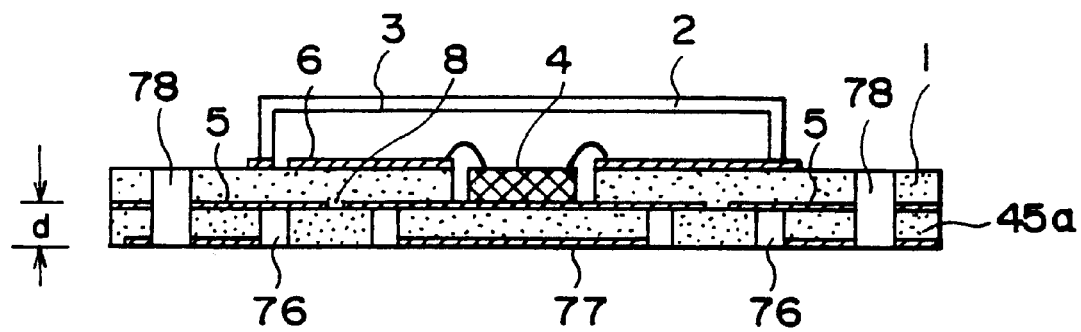
FIGS. 24A, 24B and 24C are diagrams illustrating a preferred method of connection to the package of the ground layer connection type equipped with the dielectric layer for matching the impedance.
Figure 24B:
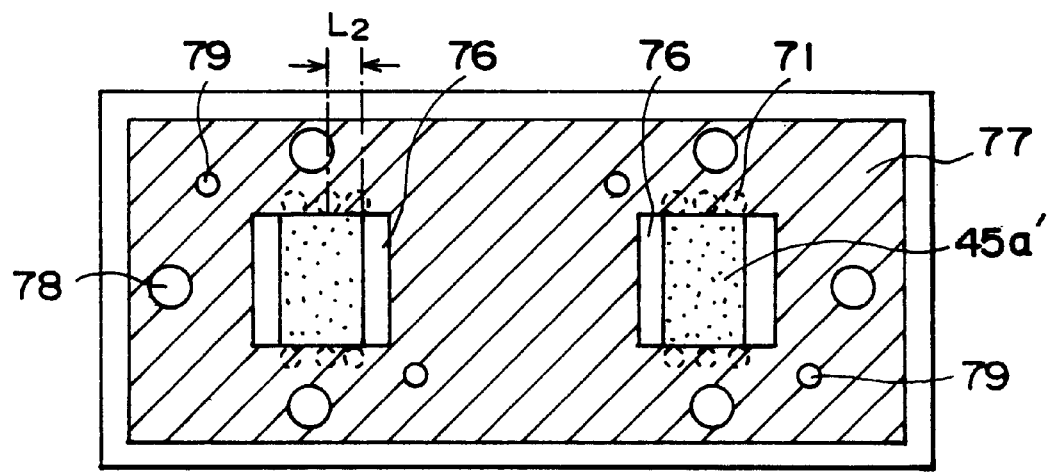
Figure 24C:
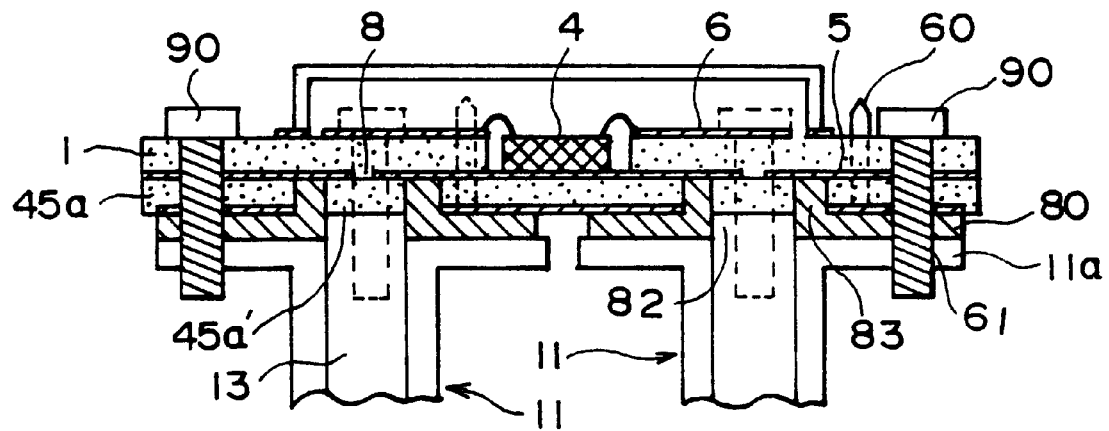
Figure 25:
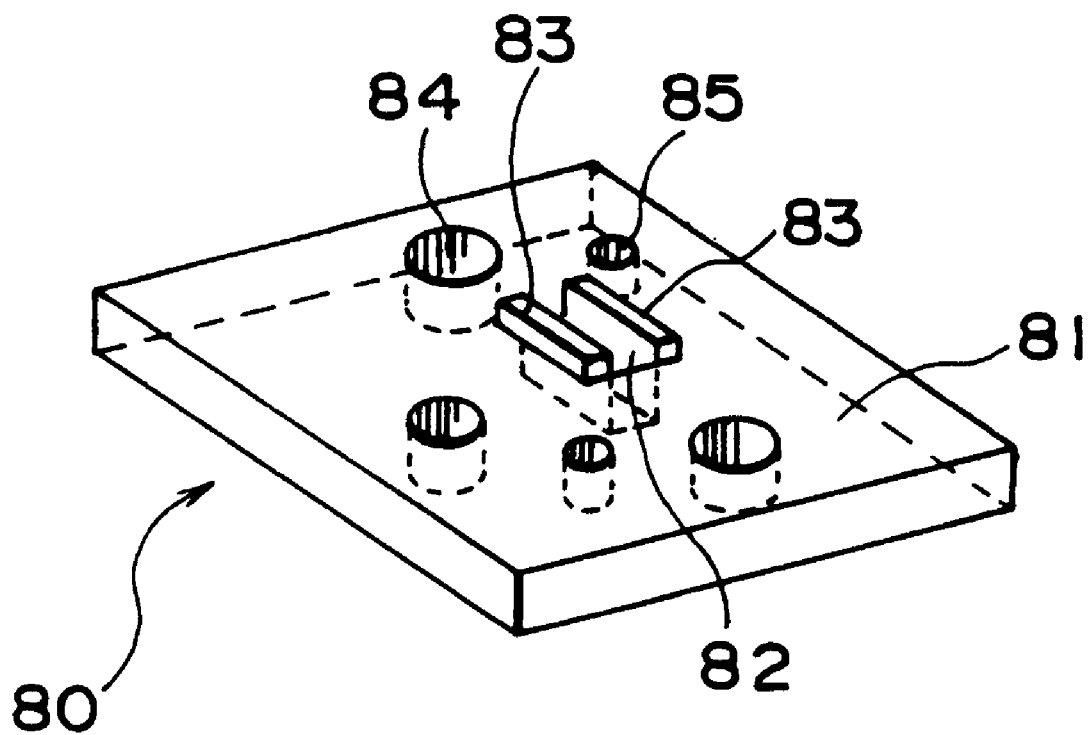
FIG. 25 is a perspective view of a connection fitting used for connecting the package shown in FIGS. 24A to 24C to the waveguide.

In the embodiment in which the openings 76 for connecting the waveguide are formed in the dielectric layer 45a as described above, the metallic connection fitting is fitted to the openings 76 for insertion, and the waveguide 11 is secured via the connection fitting. FIGS. 24A to 24C illustrate a structure for connection using such a fitting, and wherein FIG. 24A is a side sectional view of the package, FIG. 24B is a bottom view of the package, and FIG. 24C is a side sectional view illustrating the structure for connecting the package to the waveguide. FIG. 25 is a perspective view of a metallic connection fitting used for connecting the package to the waveguide.

In this case as shown in FIG. 24C, the waveguide 11 shown in FIG. 19 is used. That is, a flange portion 11a is formed at the open end of the waveguide 11, and is provided with a positioning pin 60 and a threaded hole 79. Referring to FIGS. 24A and 24B, on the other hand, the above-mentioned pair of openings 76 for insertion are formed in the dielectric layer 45a laminated on the ground layer 5 of the dielectric substrate 1, and a metal layer 77 is formed on nearly the whole surface of the dielectric layer 45a except a portion 45a' sandwiched by the openings 76. Moreover, a plurality of via-hole conductors 71 are provided on both sides of the portion sandwiched by the openings 76, and the ground layer 5 and the metal layer 77 are electrically connected together through the via-hole conductors 71. As described earlier, the via-hole conductors 71 form a false conductor wall for preventing the leakage of electromagnetic waves, and the distance $L_2$ among them is set to be not larger than one-fourth the wavelength of the transmission signals. Moreover, threaded holes 78 and holes 79 for the positioning pins are perforated in the dielectric substrate 1, in the ground layer 5, in the dielectric layer 45a and in the metal layer 77.

In FIGS. 24C and 25, metallic connection fittings 80 are fitted into the openings 76, 76, and the waveguide 11 is connected via the connection fittings 80. That is, the metallic connection fitting 80 has a base plate 81 in which is perforated an opening 82 of a size that matches with the signal transmission space 13 of the waveguide 11. On both sides of the opening 82 are formed protrusions 83 that will be fitted into the openings 76 formed in the dielectric layer 45a. In the base plate 81 are further perforated threaded holes 84 and holes 85 for positioning pins. That is, the protrusions 83 of the metallic connection fitting 80 are inserted in the openings 76 in the dielectric layer 45a, and the ends of the protrusions 83 are brought into contact with the ground layer 5. In this state, the positioning pins 60 formed on the flange portion 11a of the waveguide 11 are inserted in the holes 85 for positioning pins in the connection fitting 80 and in the holes 79 for positioning pins in the package, so that the threaded holes 61 in the flange portion 11a, the threaded holes 84 in the connection fitting 80 and the threaded holes 78 in the package are brought into match with each other. Then, screws 90 are inserted in these threaded holes 78, 84 and 61 so as to secure the waveguide 11 as shown in FIG. 24C. Therefore, the signal transmission space 13 in the waveguide 11 terminates in the ground layer 5, the signal transmission space 13 in the waveguide 11 is electromagnetically coupled to the microstrip line (a) of the package via the slot 8 formed in the ground layer 5 that becomes the terminating portion, the portion 45a' of the dielectric layer 45a sandwiched by the openings 76 and 76 works as a dielectric member for matching the impedance, and high-frequency signals are effectively transmitted. The above-mentioned junction makes it possible to reliably and easily connect the waveguide.

Figures 26A, 26B:
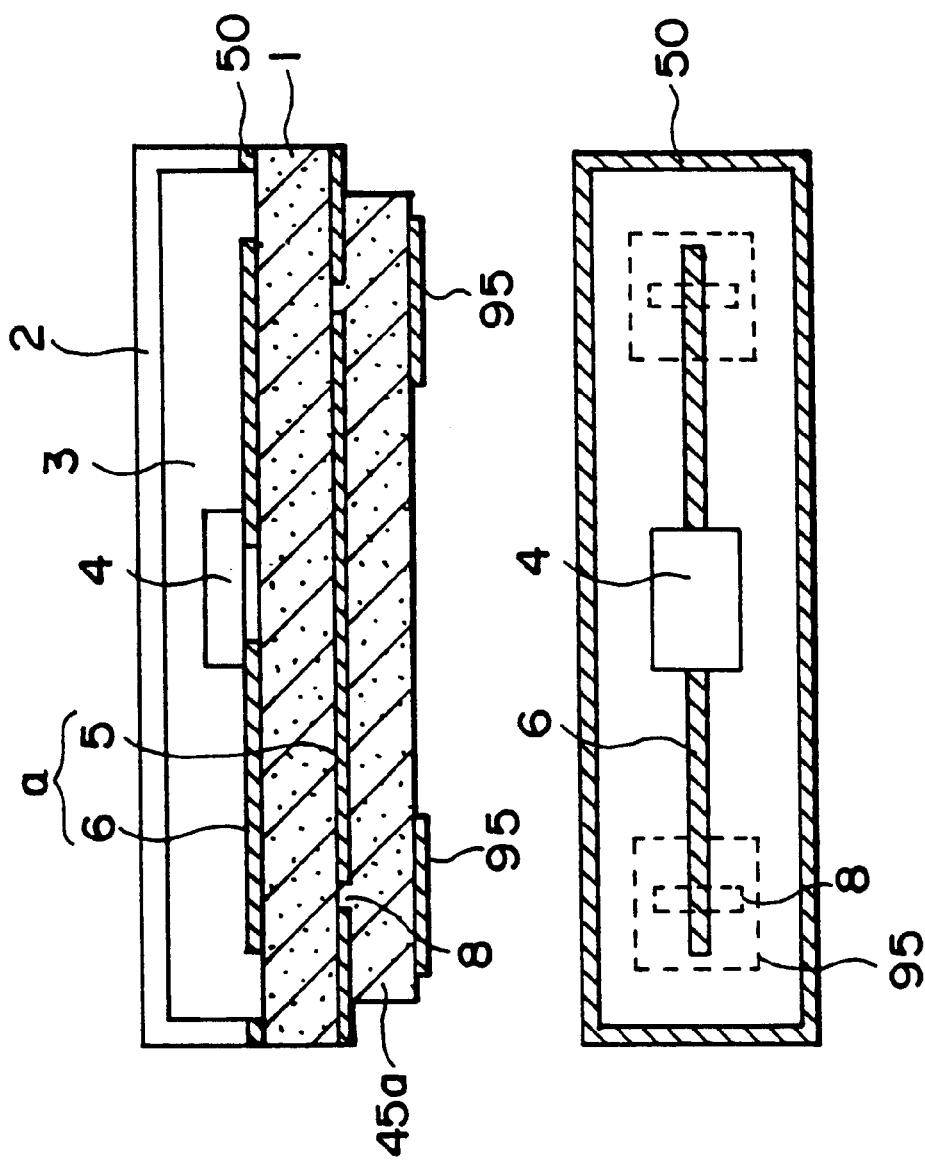
FIGS. 26A and 26B are diagrams illustrating a still further package of the ground layer connection type equipped with the dielectric layer.

According to the present invention, furthermore, the above-mentioned dielectric layer is patched with a conducting layer to improve the high-frequency signal transmission characteristics. FIGS. 26A and 26B illustrate a package patched with the conducting layer, and wherein FIG. 26A is a side sectional view of the package, and FIG. 26B is a plan view of when the closure is removed from the package.

Figure 27A:
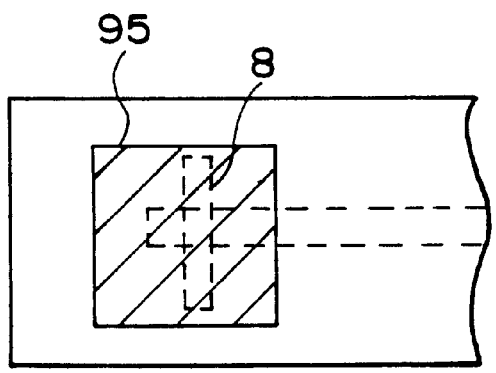
FIGS. 27A and 27B are diagrams illustrating the shapes of the conducting layers patched to the package of FIGS. 26A and 26B.
Figure 27B:
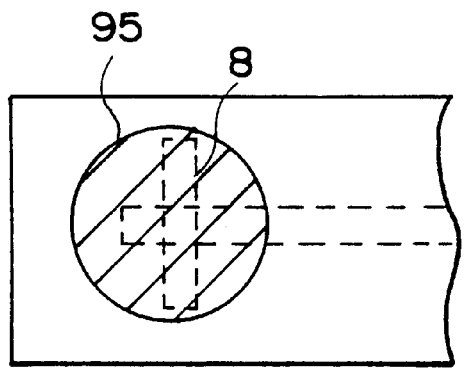

In the package shown in FIGS. 26A and 26B, the conductor layers 95 are patched on the surface of the dielectric layer 45a at positions opposed to the slots 8 in the ground layer 5. That is, to a portion where the conducting layer 95 is patched is connected the opening formed in the open end or in the side wall of the waveguide in a manner as shown in, for example, FIGS. 13A and 13B or FIGS. 14A and 14B. In this case, the waveguide is so connected that the patched conducting layer 95 is electromagnetically opened without coming into contact with the side wall of the waveguide, so that the patched conducting layer 95 works as a so-called patch antenna. As a result, high-frequency signals are efficiently transmitted between the microstrip line (a) and the signal transmission space in the waveguide through the slot 8. There is no particular limitation on the shape of the patched conducting layer 95; i.e., it may be of a rectangular shape as shown in FIG. 27A or it may be of a circular shape as shown in FIG. 27B. Though not shown in FIGS. 26A and 26B, there may be formed a number of via-hole conductors so as to surround the patched conducting layer 95 without contacted to the patched conducting layer 95 with the slot 8 as a center, in order to electrically connect the conductor wall of the waveguide to the ground layer 5. The via-hole conductors are to maintain the waveguide at the same potential as the ground layer 5 and to prevent the leakage of electromagnetic waves from the connection portion, and the distance among them is set to be not larger than one-fourth the wavelength of the transmission signals like in the above-mentioned waveguide 71.

Figure 28:
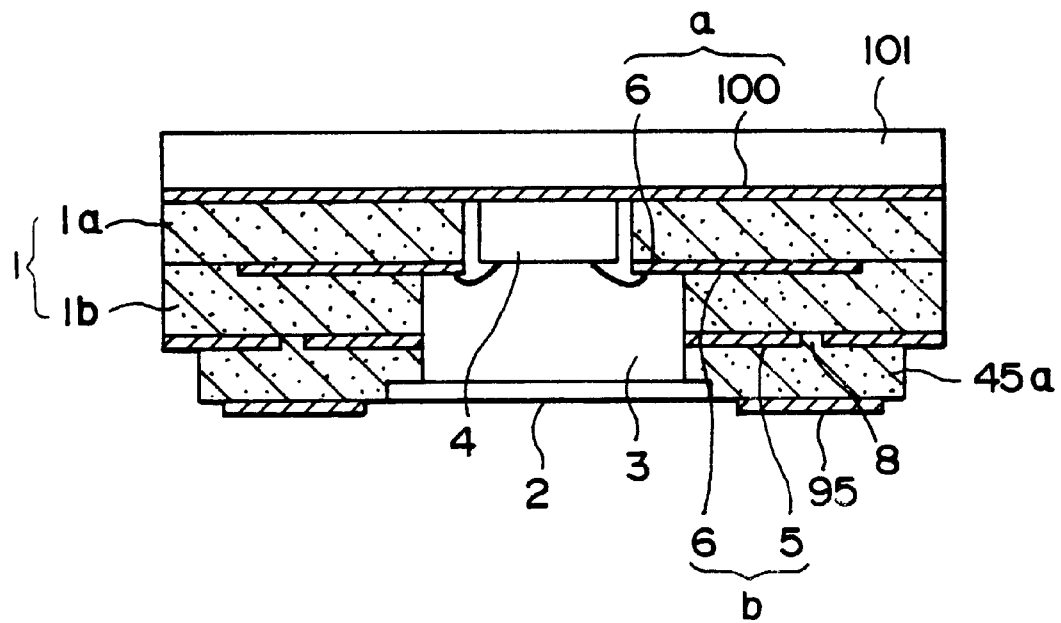
FIG. 28 is a diagram illustrating another package to which the conducting layer is patched.

The above-mentioned package of the ground layer connection type equipped with the dielectric layer or the dielectric block can be designed in a variety of ways. In the above-mentioned embodiments, the dielectric layer or the dielectric block is formed on the surface of the dielectric substrate of a side opposite to the surface on where the high-frequency element is mounted. It is, however, also allowable to provide the dielectric layer on the surface of the side on where the high-frequency element is mounted. Moreover, the package may be combined with a heat-radiating member such as heat sink. FIG. 28 is a side sectional view of such a package.

In FIG. 28, the dielectric substrate 1 is constituted by dielectric layers 1a and 1b, a conducting layer 6 is formed as an interface between the dielectric layers 1a and 1b, and a heat sink 101 is provided on the other surface of the dielectric layer 1a via a ground layer 100. A recessed portion 3 is formed in the dielectric layers 1a and 1b. A high-frequency element 4 is mounted in the recessed portion, is secured onto the heat sink 100 with the ground layer 100 being sandwiched therebetween, and is further electrically connected to the conducting layer 6. A ground layer 5 having a slot 8 is formed on the dielectric layer 1b, and a dielectric layer 45a is laminated on the ground layer 5 so as to serve as a dielectric member for matching the impedance. As will be obvious from FIG. 28, a closure 2 is adhered and secured onto the inner peripheral edge of the dielectric layer 45a, and the high-frequency element 4 is sealed in the recessed portion (cavity) 3. In this package, therefore, a first microstrip line (a) is formed by the ground layer 100 and the conducting layer 6, a second microstrip line (b) is formed by the ground layer 5 and the conducting layer 6, and the microstrip lines (a) and (b) are electromagnetically coupled together through the slot 8. The above-mentioned conducting layer 95 is patched on the dielectric layer 45a at a position opposed to the slot 8 formed in the ground layer 5, and the waveguide is connected to the portion where the conducting layer 95 is patched in a manner as shown in FIGS. 13A and 13B or as shown in FIGS. 14A and 14B. High-frequency signals transmitted through the waveguide are transmitted to the high-frequency element 4 through the hole 8 and the microstrip lines (b) and (a).

In particular, the package shown in FIG. 28 has an advantage in that the heat generated by the high-frequency element 4 is efficiently removed by the heat sink 100.

According to the above-mentioned present invention, the dielectric substrate and the dielectric layer or the dielectric block formed on the dielectric substrate are obtained by molding a powder of ceramic material such as $Al_2O_3$, AlN or $Si_3N_4$, or of a glass, or of a composite material of a glass and an inorganic filler into predetermined shapes followed by firing. It is further allowable to form a dielectric substrate and the like by using a printed board of an organic material such as epoxy resin, bismaleimide resin or-phenol resin. Furthermore, various signal transmission lines, ground layer, via-hole conductors and various conducting layers are formed by using a high-melting metal such as tungsten or molybdenum or by using a low-resistance metal such as gold, silver, copper, aluminum or platinum. They can be formed integrally with the dielectric substrate relying upon a widely known technology for lamination.

According to the above-mentioned present invention, high-frequency signals transmitted through a waveguide can be transmitted to a high-frequency element in a package with a low loss without impairing the sealing of the high-frequency element in the high-frequency package. Besides, the package is connected to the waveguide relying on a simple structure for connection, offering a great merit from an industrial point of view.

What is claimed is:

1. A high-frequency package comprising a dielectric substrate, a high-frequency element that operates in a high-frequency region mounted in a cavity disposed on said dielectric substrate, and a high-frequency signal transmission passage disposed on a surface of or in an inner portion of said dielectric substrate and electrically connected to said high-frequency element, wherein:

said high-frequency signal transmission passage has a microstrip line constituted by a linear conducting passage connected to said high-frequency element and a ground layer opposed to the linear conducting passage with the dielectric substrate sandwiched therebetween;

said ground layer has a slot disposed therein at a position opposed to an end of the linear conducting passage, said slot being electromagnetically coupled to the linear conducting passage;

a dielectric layer laminated onto the ground layer covering the slot;

a plurality of via-hole conductors provided through the dielectric layer so as to surround the slot and to electrically connect the ground layer; and a waveguide connected to the dielectric layer so that the via-hole conductors constitute a false conductor wall of a signal transmission space in the waveguide.

2. A high-frequency package according to claim 1, wherein a metallic layer is disposed between the dielectric layer and an end of the waveguide.

3. A high-frequency package according to claim 1, wherein the waveguide has an open end which is connected to the dielectric layer.

4. A high-frequency package according to claim 3, wherein a groove is disposed in the dielectric layer laminated on the ground layer so that the false conductor wall is inserted into the open end of the waveguide.

5. A high-frequency package according to claim 3, wherein a horizontal flange is disposed on the dielectric layer at the open end of said waveguide, and the waveguide is connected to the dielectric layer by securing the horizontal flange to the dielectric layer with a screw.

6. A high-frequency package according to claim 5, wherein said horizontal flange is provided with a pin for positioning the waveguide at a desired position on the dielectric layer.

7. A high-frequency package according to claim 5, wherein a metallic connector for mounting the waveguide is fitted into the dielectric layer laminated on the around layer, and the horizontal flange of the waveguide is connected to the dielectric layer via said metallic connector.

8. A high-frequency package according to claim 7, wherein said metallic connector is electrically connected to the ground layer, and the waveguide is maintained at the same potential as the ground layer by said metallic connector therebetween.

* * * * *